(12) United States Patent
Takahashi et al.

(10) Patent No.: US 6,207,976 B1
(45) Date of Patent: Mar. 27, 2001

(54) SEMICONDUCTOR DEVICE WITH OHMIC CONTACTS ON COMPOUND SEMICONDUCTOR AND MANUFACTURE THEREOF

(75) Inventors: Tsuyoshi Takahashi; Naoya Okamoto; Naoki Hara, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/110,685

(22) Filed: Jul. 7, 1998

(30) Foreign Application Priority Data

Dec. 17, 1997 (JP) ................................. 9-348155
Dec. 19, 1997 (JP) ................................. 9-351633
Feb. 24, 1998 (JP) ................................ 10-042115

(51) Int. Cl.[7] ............ H01L 31/072; H01L 31/109; H01L 31/0328; H01L 31/0336
(52) U.S. Cl. ............ 257/192; 257/194; 257/195; 257/197; 257/198; 438/602; 438/604; 438/606
(58) Field of Search ............ 257/192, 194, 257/195, 197, 198; 438/602, 604, 606

(56) References Cited

U.S. PATENT DOCUMENTS

| 4,672,414 | * | 6/1987 | Gabriel et al. ................. 357/34 |
| 4,725,565 | * | 2/1988 | Oren et al. ................. 437/168 |
| 5,264,379 | * | 11/1993 | Shikata ................. 437/31 |
| 5,393,680 | * | 2/1995 | Shikata ................. 437/40 |
| 5,689,125 | * | 11/1997 | Vaccaro et al. ................. 257/200 |

FOREIGN PATENT DOCUMENTS

| 2-170417 | 7/1990 | (JP) . |
| 3-73542 | 3/1991 | (JP) . |
| 4-48641 | 2/1992 | (JP) . |
| 4-69973 | 3/1992 | (JP) . |
| 4-199518 | 7/1992 | (JP) . |
| 4-370930 | 12/1992 | (JP) . |
| 8-88238 | 4/1996 | (JP) . |

* cited by examiner

*Primary Examiner*—William Mintel
(74) *Attorney, Agent, or Firm*—Armstrong, Westerman, Hattori, McLeland & Naughton, LLP

(57) ABSTRACT

A first surface layer made of compound semiconductor material is defined in a surface area of a substrate. A first intermediate layer is formed on the surface layer, the first intermediate layer being made of compound material having Ga as a III group element and S as a VI element and having a thickness of at least two monolayers or thicker. A first electrode is formed on the first intermediate layer, being electrically connected to the first surface layer with an ohmic contact.

22 Claims, 19 Drawing Sheets

SEMICONDUCTOR DEVICE WITH OHMIC CONTACTS ON COMPOUND SEMICONDUCTOR AND MANUFACTURE THEREOF

This application is based on Japanese Patent Applications No. 9-348155 filed on Dec. 17, 1997, No. 9-351633 filed on Dec. 19, 1997, and No. 10-42115 filed on Feb. 24, 1998, the entire contents of which are incorporated herein by reference.

BACKGROUND OF THE INVENTION a) Field of the Invention

The present invention relates to a semiconductor device and its manufacture method, and more particularly to a semiconductor device with ohmic contacts on a compound semiconductor and its manufacture method.

b) Description of the Related Art

An $SiO_2$ film formed on the surface of a silicon substrate is a good insulating film with a low density of surface states. It is difficult, however, to form a good insulating film with a low density of surface states on the surface of a compound semiconductor. For example, although SiN, $SiO_2$, $Ga_2O_3$ and the like have been studied as materials of an insulating film to be formed on the surface of GaAs, it is difficult to lower the density of surface states.

Since a good interface between a compound semiconductor and an insulating film cannot be obtained, it is difficult to form an FET (MISFET) of a metal/insulator/semiconductor structure by using a compound semiconductor such as GaAs. In order to solve this interface problem between semiconductor and insulator, other structures have been adopted, such as a high electron mobility transistor (HEMT) and an FET (MESFET) of a metal/semiconductor structure using Schottky contacts between a gate electrode and the semiconductor without forming a gate insulating film between the channel region and the gate electrode.

A potential barrier between GaAs and metal becomes nearly constant (about 0.8 eV) independent from the work function of metal, because of the pinning effect of GaAs. Therefore, an energy level difference becomes large between the Fermi level of metal and the level at the lower end of the conduction band of GaAs, and the electrical resistance of an ohmic contact between n-type GaAs and metal is likely to increase.

As an approach to lowering the resistance, a method of processing the surface of GaAs with a solution of $(NH_4)S_x$ or NaS is now being studied. This process bonds Ga atoms exposed on the GaAs surface with S atoms, forming Ga—S bonds. The GaAs surface is covered with S atoms of approximately one atomic layer and is made chemically stable. With this method, a photoluminescence intensity increases and the potential barrier at an interface between the GaAs and the metal becomes dependent upon a metal work function.

The pinning effect can be eliminated by covering the GaAs surface with S atoms of approximately one atomic layer. However, deposition of an SiN film, an $SiO_2$ film or the like on the S atom layer considerably lowers the photoluminescence intensity and suppresses the pinning effect elimination. In addition, deposition of a metal layer on the S atom layer makes metal atoms in the metal layer react with GaAs during heat treatment, so that the pinning effect elimination is suppressed.

FETs using a compound semiconductor, typically GaAs, have been used as high frequency electronic devices. For example, GaAs MESFETs are widely used for a mobile communications system such as cellular phones, and HEMTs for a satellite broadcasting reception antenna.

Needless to say, high frequency FETs are required to have high gains and low noises. A breakdown voltage is also an important factor for determining operation ratings. One factor of determining a breakdown voltage of FET is a surface trap level at the interface between a semiconductor layer and a passivation film of FET.

Generally, the density of surface states at the interface between the compound semiconductor and an insulating film used as a passivation film is higher than that at the interface between an Si and an $SiO_2$ film, as described above. In order to prevent any trap caused by the surface trap level near the gate electrode of an FET, a buried gate structure has been used conventionally. The breakdown voltage is mostly influenced by the surface trap level.

With the buried gate structure, the gate electrode is buried in a channel layer of a compound semiconductor or in a cap layer. The side walls of the gate electrode directly contact the channel layer or cap layer. Since the interface between the channel or cap layer and an insulating film can be positioned remotely from the channel region under the gate electrode, traps by the surface trap level can be prevented.

The density of surface states can be lowered by depositing an insulating film after the surface of the compound semiconductor is cleaned sufficiently.

With the buried gate structure, the side walls of the gate electrode contact the channel or cap layer. It is therefore necessary to suppress leakage current from flowing through the contact area. From this reason, the impurity concentration of the channel or cap layer cannot be made high.

With the method of depositing an insulating film after the surface of the channel layer is cleaned, it is difficult to lower the density of surface states to a sufficiently low value.

The property of ohmic contacts of a high speed semiconductor device directly influences the device performance. It has been therefore desired to form an ohmic contact having a low contact resistance and an excellent ohmic contact property.

The structure and manufacture method of a conventional ohmic contact will be described, by taking as an example an n-type GaAs typical to a group III–V compound semiconductor. For example, in order to form an ohmic contact on an n-type GaAs, AuGeNi alloy is deposited on GaAs to make an alloy of AuGeNi and GaAs and form an ohmic contact layer. If n-type dopants are diffused at a high concentration near the surface layer of GaAs, the Schottky barrier layer can be made thin and tunneling of electrons through this layer becomes easy. This tunneling current realizes an ohmic contact. It is difficult, however, to control the diffusion of Ge by heat treatment. In order to improve the controllability and reliability of manufacturing processes, it is desired to form an ohmic contact of non-alloy without performing heat treatment.

An ohmic contact of non-alloy may be formed by eliminating the Fermi level pinning and contacting GaAs with a metal having a low work function to lower the Schottky barrier.

From this viewpoint, the present inventors have tried to form an ohmic contact of non-alloy. The present inventors also disclosed in JP-A-8-248170 a method of lowering the density of surface states of GaAs to $5 \times 10^{10} eV^{-1} cm^{-2}$ by depositing a GaS layer on GaAs by molecular beam epitaxy (MBE) using as a source material tertiary-butyl-gallium-sulfide cubane $((t-Bu)GaS)_4$.

SUMMARY OF THE INVENTION

It is an object of the present invention to provide a semiconductor device using a compound semiconductor having a low density of surface states, and its manufacture method.

According to one aspect of the present invention, there is provided a semiconductor device comprising: a substrate having a first surface layer in a surface area, the first surface layer being made of a compound semiconductor material; a first intermediate layer formed on the first surface layer, made of a compound material containing Ga as a group III element and S as a group VI element, and having a thickness of at least two monolayers or thicker; and a first electrode formed on the first intermediate layer, the first electrode being electrically connected to the first surface layer with an ohmic contact.

By inserting the first intermediate layer between the first surface layer and the first electrode, the density of surface states of the first surface layer can be lowered. It is therefore possible to electrically connect the first electrode to the first surface layer with an ohmic contact, easily.

According to another aspect of the present invention, there is provided a semiconductor device comprising: a substrate having a principal surface; a collector layer formed on the principal surface of the substrate and made of a compound semiconductor material of a first conductivity type; a base layer formed on a partial surface area of the collector layer and made of a compound semiconductor material of a second conductivity type opposite to the first conductivity type; an emitter layer formed on a partial surface area of the base layer and made of a compound semiconductor material of the first conductivity type; a collector electrode formed on a surface of the collector layer where the base layer is not formed, the collector electrode being electrically connected to the collector layer with an ohmic contact; a base electrode formed on a surface of the base layer where the emitter layer is not formed, the base electrode being electrically connected to the base layer with an ohmic contact; an emitter electrode formed on a surface of the emitter layer and electrically connected to the emitter layer with an ohmic contact; and an intermediate layer disposed at least one area between the collector electrode and the collector layer, between the base electrode and the base layer, or between the emitter electrode and the emitter layer, the intermediate layer being made of a compound material containing Ga as a group III element and S as a group VI element and having a thickness of at least two monolayers or thicker.

By inserting the intermediate layer between the electrode and the compound semiconductor layer, the density of surface states of the compound semiconductor layer can be lowered. It is therefore possible to electrically connect the electrode to the compound semiconductor layer with an ohmic contact.

According to another aspect of the present invention, there is provided a method of manufacturing a semiconductor device comprising the steps of: depositing an intermediate layer on a surface layer of a substrate, the surface layer being made of a compound semiconductor material, and the intermediate layer being made of a compound material containing Ga as a group III element and S as a group VI element and having a thickness of at least two monolayers or thicker allowing a tunneling current to flow therethrough; and forming an electrode on the intermediate layer.

By inserting the intermediate layer between the surface layer and the electrode, the density of surface states of the surface layer can be lowered. It is therefore possible to electrically connect the electrode to the surface layer with an ohmic contact.

It is another object of the present invention to provide a semiconductor device and its manufacture method capable of suppressing traps to be caused by the surface trap level near at a gate electrode and preventing the FET characteristics from being degraded by traps.

According to another aspect of the present invention, there is provided a semiconductor device comprising: a substrate having a surface layer made of a compound semiconductor material; a source electrode and a drain electrode directly formed on the surface layer of the substrate and spaced apart by a certain distance in an in-plane of the surface layer; a gate electrode formed on a surface area of the surface layer between the source electrode and the drain electrode and spaced apart from the source electrode and the drain electrode by a certain distance; and a GaS compound layer covering surface areas of the surface layer of the substrate between the gate electrode and the drain electrode and between the source electrode and the drain electrode and having a thickness of at least two monolayers or thicker.

According to another aspect of the present invention, there is provided a method of manufacturing a semiconductor device comprising the steps of: forming a source electrode and a drain electrode on a surface layer of a substrate, the surface layer being made of a compound semiconductor material and the source electrode and the drain electrode being spaced apart by a certain distance in an in-plane of the surface layer; forming a gate electrode on a surface area of the surface layer between the source electrode and the drain electrode, the gate electrode being spaced apart from the source electrode and the drain electrode by a certain distance; and covering surface areas of the surface layer of the substrate between the gate electrode and the drain electrode and between the source electrode and the drain electrode, with a GaS compound layer having a thickness of at least two monolayers or thicker.

By covering the surface of the surface layer made of compound semiconductor with the GaS compound layer, the density of surface states of the surface layer can be lowered. The degraded characteristics of devices to be caused by the density of surface states, such as a lowered breakdown voltage, can be prevented.

According to another aspect of the present invention, there is provided a method of manufacturing a semiconductor device, comprising the steps of: depositing a GaS compound layer on a surface layer of a substrate, the surface layer being made of a compound semiconductor material and the GaS compound layer having a thickness of at least two monolayers or thicker; forming first and second openings through the GaS compound layer, the first and second opening being spaced apart by a certain distance in an in-plane of the GaS compound layer, to expose the surface layer of the substrate on bottoms of the first and second openings; forming a source electrode and a drain electrode on the bottoms of the first and second openings, the source electrode and the drain electrode being electrically connected to the surface layer of the substrate with ohmic contacts; and forming a gate electrode on a surface area of the surface layer of the substrate between the first and second openings.

The GaS compound layer is deposited before the source, drain, and gate electrodes are formed. Therefore, each electrode will not be exposed to a high temperature environment when the GaS compound layer is deposited, so that materials having a relatively low melting point can be used as the electrode materials.

According to another aspect of the present invention, there is provided a method of manufacturing a semiconductor device, comprising the steps of: depositing a channel layer on a substrate having a principal surface, the channel layer being made of a non-doped compound semiconductor material; depositing a carrier supply layer on the channel layer, the carrier supply layer being made of a compound semiconductor material doped with n- or p-type impurities; depositing a first cap layer on the carrier supply layer, the first cap layer being made of a compound semiconductor material of a conductivity type same as the carrier supply layer; forming a source electrode and a drain electrode on the first cap layer, the source electrode and the drain electrode being spaced apart by a certain distance in an in-plane of the source and drain electrodes; forming a gate groove in an area between the source electrode and the drain electrode, the gate groove having a depth not reaching the channel layer; forming a gate electrode on a bottom of the gate groove; and covering surfaces exposed between the source electrode and the gate electrode and between the drain electrode and the gate electrode, with a GaS compound layer.

Since the inner surface of the gate groove and the surface of the cap layer are covered with the GaS compound layer, the density of surface states can be lowered. The degraded characteristics of devices to be caused by the density of surface states, such as a lowered breakdown voltage, can be prevented.

It is a further object of the present invention to provide a semiconductor device having an ohmic contact of non-alloy capable of obtaining a contact resistivity as small as about that of an ohmic contact of alloy.

According to another aspect of the present invention, there is provided a semiconductor device comprising: a group III–VI compound semiconductor layer: an ohmic contact layer formed on the group III–V compound semiconductor layer, the ohmic contact layer containing at least Ti, and S, Se or Te; and a metal layer formed on the ohmic contact layer.

The contact resistance between the group III–V compound semiconductor layer and the metal layer can be lowered to a value approximately equal to that of an alloy type structure using AuGeNi.

According to another aspect of the present invention, there is provided a semiconductor device comprising: a channel layer formed on a semiconductor substrate; an electron supply layer formed on the channel layer; a contact layer formed on the electron supply layer and made of a group III–V compound semiconductor material; an ohmic contact layer formed on the contact layer, the ohmic contact layer containing at least Ti, and S, Se or Te; a source electrode and an drain electrode formed on the ohmic contact layer; and a gate electrode formed on the electron supply layer between the source electrode and the drain electrode.

The contact resistance between the source/drain electrode and the contact layer can be lowered to a value approximately equal to that of a alloy type structure using AuGeNi. It is therefore possible to obtain an ohmic contact having a low resistance and an excellent reliability.

The ohmic contact layer is preferable made of one of materials including TiGaS, TiS, TiGaSe, TiSe, TiGaTe, and TiTe.

The group III–V compound semiconductor layer is preferably made of one of materials including GaAs, AlGaAs, InGaAs, InAlAs, InGaP, InAlP, InGaAlAs, InGaAlP, InP, GaP, and AlP.

According to another aspect of the present invention, there is provided a method of manufacturing a semiconductor device comprising the step of forming an ohmic contact layer on a group III–V compound semiconductor layer, the ohmic contact layer containing at least Ti, and S, Se or Te.

An ohmic contact to the group III–V compound semiconductor layer can be formed which has contact resistance approximately equal to that of an alloy type structure using AuGeNi.

The ohmic contact layer is preferable grown by molecular beam epitaxy. The ohmic contact layer can be formed directly on the group III–V compound semiconductor layer by MBE.

In the above manufacture method, the step of forming the ohmic contact layer may comprise the steps of: forming a first layer on the group III–V compound semiconductor layer, the first layer being made of one of materials selected from a group consisting of GaS, GaSe, and GaTe; forming a Ti layer on the first layer; and reacting the first layer with the Ti layer to form the ohmic contact layer containing at least Ti and S.

DETAILED DESCRIPTION OF THE PREFERRED EMBODIMENTS

The first embodiment of the invention will be described by taking as an example an ohmic contact between a GaAs substrate and a metal electrode.

Figure 1A:
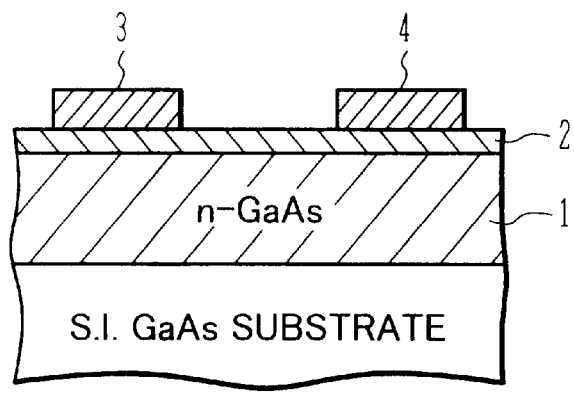
FIG. 1A is a cross sectional view of a semiconductor device according to a first embodiment of the invention.

FIG. 1A is a cross sectional view of a semiconductor device according to the first embodiment. A semi-insulating GaAs substrate has an n-type conductivity GaAs layer 1 formed thereon. On this GaAs layer 1, a GaS layer 2 is formed. Electrodes 3 and 4 are formed on two spaced surface regions of the GaS layer 2. A sheet resistance of the GaAs layer 1 is $200\Omega/cm^2$, and a thickness of the GaS layer is 10 nm. The electrodes 3 and 4 are rectangular having an area of 150 $\mu$m×200 $\mu$m. A space between the electrodes 3 and 4 is set to 40 $\mu$m.

For example, the GaS layer is formed by vacuum vapor deposition using tertiary-butyl-gallium-sulfide cubane as a solid source material, and the electrodes 3 and 4 are formed by vacuum vapor deposition using lift-off.

Figure 1B:
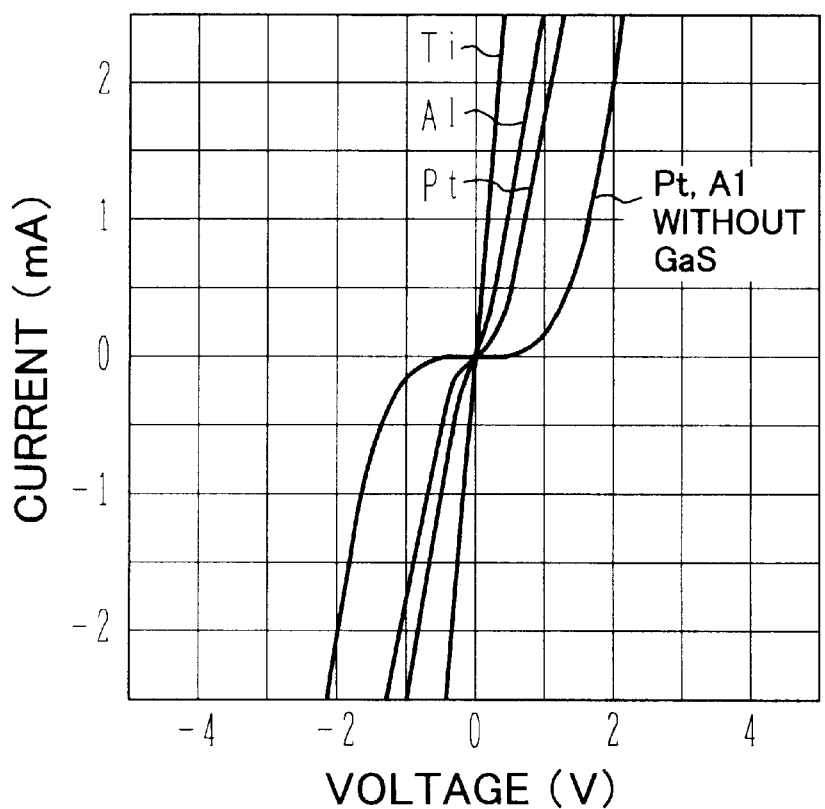
FIG. 1B is a graph showing the current-voltage characteristics of the semiconductor device.

FIG. 1B shows the current-voltage characteristics when a voltage is applied between the electrodes 3 and 4. The materials of the electrodes 3 and 4 were Ti, Al and Pt. For comparison, the current-voltage characteristics when the electrodes 3 and 4 of Al or Pt are directly formed on the GaAs layer 1 are also shown.

If the GaS layer 2 is not formed, current starts flowing when an applied voltage is raised to about 0.5 V or higher. This is because the Schottky barrier is formed between the electrode 4 and GaAs layer 1. Because of the pinning effect at the GaAs surface, the Schottky barrier is generally constant independently of the metal material of the electrodes 3 and 4. Therefore, the current-voltage characteristics are almost similar even if different electrode materials Pt and Al are used.

If the GaS layer 2 is inserted between the GaAs layer 1 and the electrodes 3 and 4, the current-voltage characteristics change with the material of the electrodes 3 and 4. As the work function of electrode material becomes larger, the current becomes more difficult to flow. This implies a release of the pinning effect on the surface of GaAs. If Ti having a small work function is used as the electrode material, the current-voltage characteristics become generally ohmic.

It can be generally considered that a resistance between metal and semiconductor material having a large band gap is inserted therebetween. However, in this embodiment, irrespective of the insertion of the GaS layer having a large band gap between the metal and GaAs layer, the resistance therebetween lowers. This may be ascribed to the fact that since a tunnelling current flows through a thin GaS layer, the insertion of the GaS layer does not increase the resistance but rather the pinning effect is eliminated.

Figure 2:
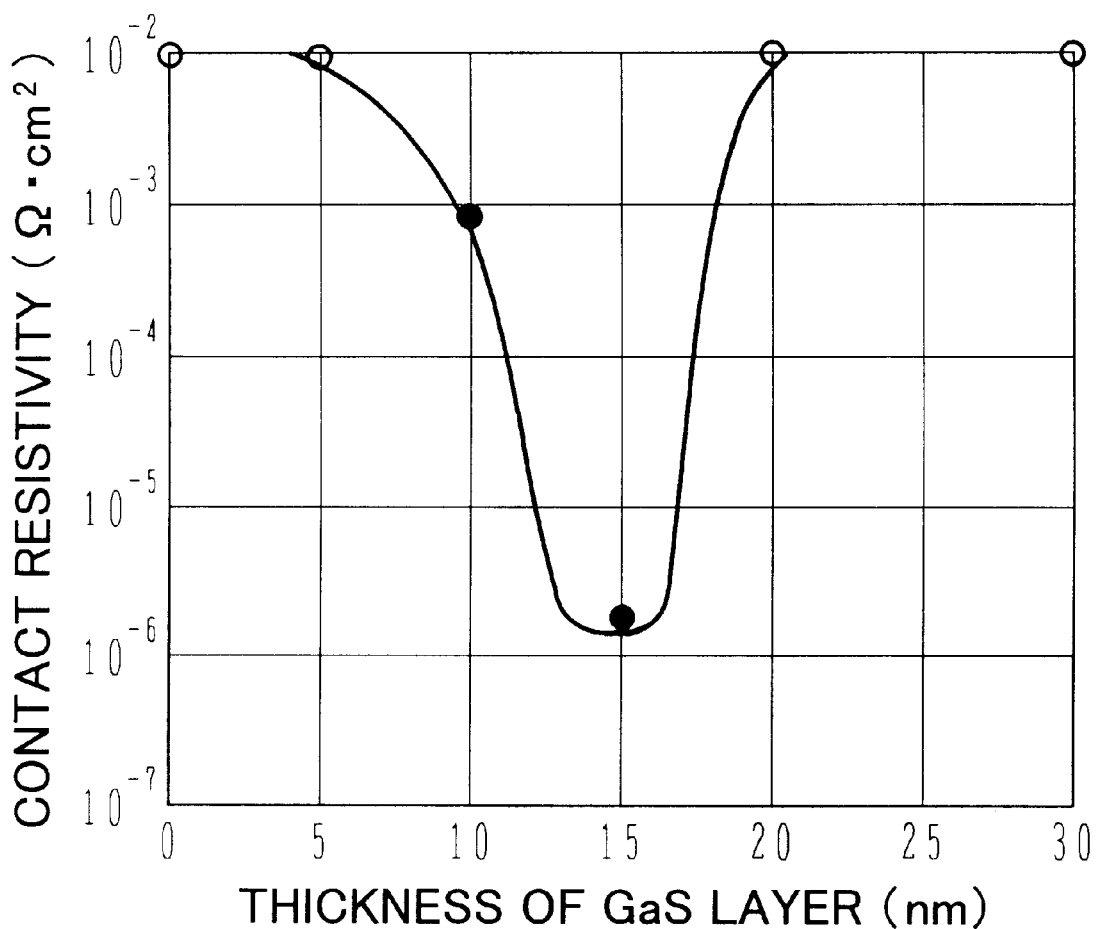
FIG. 2 is a graph showing an electrical resistance between an electrode and GaAs, as a function of a thickness of a GaS film inserted therebetween.

FIG. 2 is a graph showing the contact resistance between the GaAs layer 1 and the electrode 3 or 4 shown in FIG. 1A, as a function of the thickness of the GaS layer 2. The abscissa represents the thickness of the GaS layer in the unit of nm, and the ordinate represents a contact resistivity in the unit of $\Omega \cdot cm^2$. Ti was used as the electrode material. A solid black circle in FIG. 2 indicates that the current-voltage characteristics of generally an ohmic nature are obtained, and an empty while circle indicates that the current-voltage characteristics like a Schottky contact are obtained.

As the thickness of the GaS layer is made thinner than 5 nm, the characteristics become like a Schottky contact. This may be ascribed to the fact that since the GaS layer 2 is too thin, the GaS regions are formed and distributed in the shape of islands on the surface of the GaAs substrate and the whole surface is not completely covered with the GaS layer 2. As the thickness of the GaS layer is made thicker than 20 nm, the characteristics also become like a Schottky contact. This may be ascribed to the fact that the GaS is too thick so that the tunnelling current is difficult to flow therethrough.

As seen from FIG. 2, the thickness range of the GaS layer 2 is preferably from 5 to 20 nm, and more preferably from 10 to 15 nm. If a GaS layer thinner than 5 nm can be stably formed over the whole surface of the GaAs substrate, by optimizing film forming conditions or a film forming method, the thickness of the GaS layer may be made thinner than 5 nm. It is preferable to set the thickness of the GaS layer 2 to two atomic monolayers or thicker so that the GaS layer is left between the GaAs layer 1 and the electrodes 3 and 4 even if parts of the GaAs layer 2 and the electrodes 3 and 4 react with each other. A monolayer means a single layer formed by pairs of one Ga atom and one S atom.

In FIG. 1A, the intermediate layer 2 inserted between the GaAs substrate 1 and the electrodes 3 and 4 is made of non-doped GaS. It can be expected that if the conductivity type of the intermediate layer 2 is the same as that of the GaAs layer 1, the contact resistance is reduced further. Instead of GaS, the material of the intermediate layer 2 may be a compound material containing Ga as group III and S as group VI.

In FIG. 1A, although GaAs is used as the substrate, the same effects can be expected even if other compound semiconductor materials are used. For example, the substrate material may be GaAs, AlGaAs, InGaP, InP, InGaAs, InAlAs, InAlGaAs; GaN, AlGaN, InGaN, InAlN, InN, AlN, InAlGaN, InGaAsN, InAlAsN, and InAlGaAsN.

Figure 3:
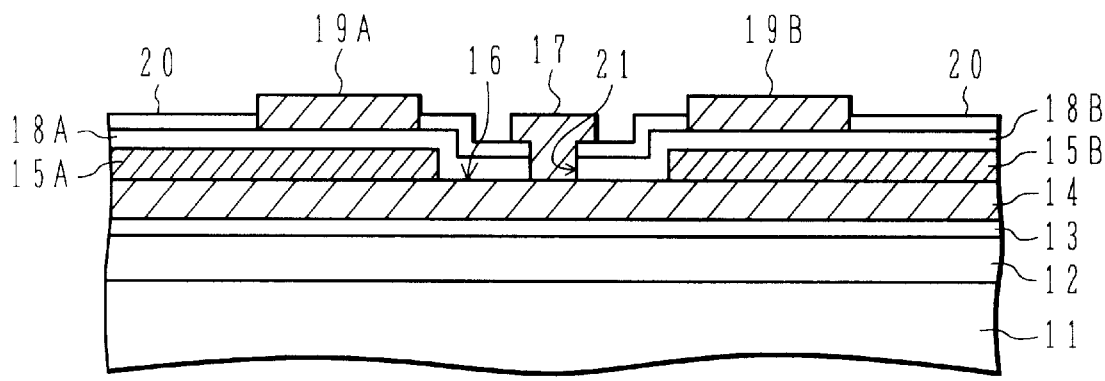
FIG. 3 is a cross sectional view of a HEMT according to the first embodiment.

FIG. 3 shows an example of the structure of a HEMT formed by applying the first embodiment. Formed on the surface of a semi-insulating GaAs substrate 11 are a buffer layer 12 of 500 nm in thickness made of non-doped high resistance GaAs, a channel layer 13 of 14 nm in thickness made of non-doped $In_{0.2}Ga_{0.8}As$, and a carrier supply layer 14 of 25 nm in thickness made of n-type InGaP, in this order from the bottom. The carrier supply layer 14 is doped with Si as n-type impurities at a concentration of $2\times10^{18}cm^{-3}$.

On the surface of the carrier supply layer 14, a first surface layer 15A and a second surface layer 15B respectively of 70 nm in thickness are disposed spaced apart by a certain distance. Between the first and second surface layers 15A and 15B, a gate recess 16 is defined, on the bottom of which the upper surface of the carrier supply layer 14 is exposed. The first and second surface layers 15A and 15B are made of n-type GaAs doped with Si at a concentration of $5\times10^{18}cm^{-3}$.

A gate electrode 17 of Al is formed on the surface of the carrier supply layer 14 exposed on the bottom of the gate recess 16. The gate electrode 17 forms a Schottky contact with the channel layer 13.

The surfaces of the first and second surface layers 15A and 15B are covered with first and second intermediate layers 18A and 18B made of GaS and having a thickness of 10 nm. The first intermediate layer 18A also covers a partial surface of the carrier supply layer 14 exposed on the bottom of the gate recess 16 between the first surface layer 15A and gate electrode 17. Similarly, the second intermediate layer 18B also covers a partial surface of the carrier supply layer 14 between the second surface layer 15B and gate electrode 17.

On partial surface areas of the first and second intermediate layers 18A and 18B, first and second electrodes 19A and 19B made of Al are formed. The surfaces of the first and second intermediate layers 18A and 18B not covered with the first and second electrodes 19A and 19B are covered with a passivation film 20 of SiN.

Since the first intermediate layer 18A is inserted between the first electrode 19A and the first surface layer 15A, the first electrode 19A can have an ohmic contact to the first surface layer 15A. Similarly, the second electrode 19B can have an ohmic contact to the second surface layer 15B.

Furthermore, the first intermediate layer 18A covers the first surface layer 15A and the partial surface area of the carrier supply layer 14 between the first electrode 19A and gate electrode 17, and the second intermediate layer 18B covers the second surface layer 15B and the partial surface area of the carrier supply layer 14 between the second electrode 19B and gate electrode 17. Therefore, the surface of the channel layer 14 can be chemically stabilized and the operation stability of the HEMT can be improved.

Next, a manufacture method of HEMT shown in FIG. 3 will be described. The buffer layer 12 of 500 nm in thickness made of non-doped high resistance GaAs, channel layer 13 of 14 nm in thickness made of non-doped $In_{0.2}Ga_{0.8}As$, and carrier supply layer 14 of 25 nm in thickness made of n-type InGaP are deposited on the surface of the semi-insulating GaAs substrate 11 in this order from the bottom. An n-type GaAs layer doped with Si at a concentration of $5 \times 10^{18} cm^{-3}$ to be used as the first and second surface layers 15A and 15B is deposited to a thickness of 70 nm on the first and second surface layers 15A and 15B.

Deposition of the above layers is performed, for example, by metal organic CVD (MOCVD). Triethylgallium (TEG), trimethylindium (TMI), arsine ($AsH_3$) and phosphine ($PH_3$) may be used as the source materials of Ga, In, As and P, respectively. Silane ($SiH_4$) may be used as the source material of Si as n-type impurities. The growth temperature is, for example, 600 to 700° C.

The GaAs layer is patterned to leave the first and second surface layers 15A and 15B and define the gate recess 16. For example, the GaAs layer is wet-etched by using mixture solution of $H_3PO_4$, $H_2O_2$ and $H_2O$. This etchant can selectively etch the GaAs layer relative to the InGaP carrier layer 14.

The substrate formed with the gate recess is placed in a GaS deposition chamber. A natural oxide film formed on the substrate surface is removed with tridimethylarsine under the conditions of a substrate temperature of 500° C. and a process time of 10 minutes. In succession, GaAs and InGaP on the substrate surface are etched with HCl gas by an amount of several atom layers to thereby clean the surface. A GaS film is deposited on the substrate surface to a thickness of 10 nm by using solid source material of tertiary-butyl-gallium-sulfide cubane under the conditions of a substrate temperature of 350 to 500° C.

An SiN film is deposited on the GaAs film to a thickness of 50 nm by plasma enhanced CVD (PE-CVD). A resist film is coated on the SiN film and formed with an opening of 0.4 μm in width in the area corresponding to the gate electrode 17. By using this resist film as a mask, the SiN film and GaS film are etched to form an opening 21. The first and second intermediate layers 18A and 18B made of GaS are therefore defined. For example, the SiN film is etched by reactive ion etching (RIE) using fluorine containing gas, and the GaS film is etched by RIE using chlorine containing gas. After the GaS film is etched, the resist film used as the etching mask is removed.

A resist film is formed covering the first and second intermediate layers 18A and 18B and formed with openings in the areas corresponding to the first and second electrodes 19A and 19B. By using this resist film as a mask, the SiN film is etched. In the areas where the first and second electrodes 19A and 19B are formed, the first and second intermediate layers 18A and 18B are exposed on the bottoms of the openings.

An Al film is deposited to a thickness of about 500 nm over the whole surface of the substrate. The resist mask is removed so that the Al film on the resist mask is lifted off to leave the first and second electrodes 19A and 19B in the openings. An opening for the gate electrode 17 is patterned through photolithography. This opening is set slightly larger than the opening 21.

An Al film is deposited to a thickness of about 500 nm over the whole surface of the substrate. The resist mask is removed so that the Al film on the resist mask is lifted off to leave the gate electrode in the opening. With the above processes, the HEMT shown in FIG. 3 can be manufactured.

A resist film used for lift-off may be a two-layer resist film. A resist film having a high sensitivity is used as the lower resist film, whereas a resist film having a low sensitivity is used as the upper resist film. With this two-layer resist film, an opening having a lateral recess in the lower side wall is formed. Therefore, an Al film deposited on the bottom of the opening is difficult to connect the Al film deposited on the upper surface of the resist film so that lift-off becomes easy.

The embodiment applied to the HEMT shown in FIG. 3 has been described. If the channel layer 13, carrier supply layer 14, first and second surface layers 15A and 15B are all made of n-type GaAs, a MESFET can be manufactured. Similar to the HEMT, a MESFET of this structure can form an ohmic contact of the first electrode 19A to the first surface layer 15A and an ohmic contact of the second electrode 19B to the second surface layer 15B. Further, since the GaAs surface is not covered with the GaS film, the operation stability can be improved.

Figure 4:
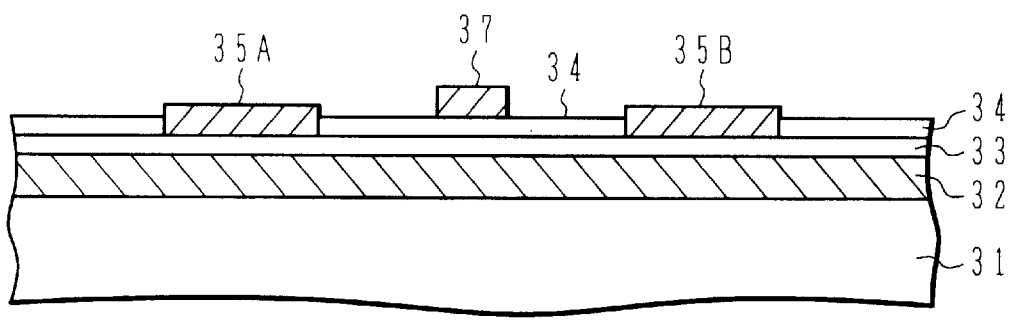
FIG. 4 is a cross sectional view of a MISFET according to the first embodiment.

Next, a MISFET formed by applying the first embodiment will be described with reference to FIG. 4 showing the cross sectional view of the MISFET. Formed on the surface of a semi-insulating GaAs substrate 31 is a channel layer 32 of 300 nm in thickness made of p-type GaAs doped with carbon (C) at a concentration of $3 \times 10^{15} cm^{-3}$. An intermediate layer 33 of 5 nm in thickness made of GaS is formed on the channel layer 32.

On the surface of the intermediate layer 33, first and second electrodes 35A and 35B are formed spaced apart by a certain distance. The surface of the intermediate layer 33 where the first and second electrodes 35A and 35B are not formed, is covered with an SiN film 34. A gate electrode 37 is formed on the SiN film 34 between the first and second electrodes 35A and 35B.

The gate electrode 37, and first and second electrodes 35A and 35B each have a three-layer structure stacking Ti, Pt and Au in this order from the bottom. Ti has a relatively small work function so that a resistance between the n-type channel layer 32 and the electrodes 35A and 35B can be lowered. Au lowers the resistance of the electrode itself. Pt can prevent diffusion of Au to the substrate.

The first and second electrodes 35A and 35B have ohmic contacts to the channel layer 32 via the intermediate layer 33. The insulating SiN film 34 is inserted between the gate electrode 37 and the channel layer 32. These three layers constitute the MIS structure.

In the MIS structure using compound semiconductor, the density of surface states at the interface between insulator and semiconductor is generally high. It is therefore difficult to form an inversion layer in the surface layer of semiconductor. However, by inserting the GaS intermediate layer 33 between the SiN film 34 and channel layer 32 as shown in FIG. 4, the density of surface states can be lowered. According to the experiments made by the present inventors, the density of surface states can be lowered to about $1\times10^{11}eV^{-1}cm^{-2}$. A usual density of surface states is about $1\times10^{13}$ to $1\times10^{14}eV^{-1}cm^{-2}$. Since the density of surface states at the semiconductor surface can be lowered, the inversion layer can be formed in the surface layer of the channel layer 32.

Since the surface of the GaAs channel layer 32 is covered with the GaS intermediate layer 33, the surface of the channel layer 32 can be chemically stabilized and the operation stability of the MISFET can be improved.

Next, a manufacture method of the MISFET shown in FIG. 4 will be described. The channel layer 32 of p⁻-type GaAs is deposited by MOCVD on the surface of the semi-insulating GaAs substrate 31. The intermediate layer 33 of GaS and the SiN film 34 are formed over the channel layer 32. The intermediate layer 33 and SiN film 34 are formed by a method similar to the method of forming the intermediate layers 18A and 18B and SiN film 20 shown in FIG. 3.

Openings are formed in the SiN film 34 in the areas corresponding to the first and second electrodes 35A and 35B. For example, the SiN film is wet-etched with buffered hydrofluoric acid. The gate electrode 37 and first and second electrodes 35A and 35B are formed by lift-off.

With the above method, the gate electrode 37 and first and second electrodes 35A and 35B are formed at the same time. With such a simple process, the gate electrode has the MIS structure and the first and second electrodes have ohmic contacts to form the MISFET.

Next, a hetero bipolar transistor (HBT) formed by applying the first embodiment will be described with reference to FIG. 5.

Figure 5:
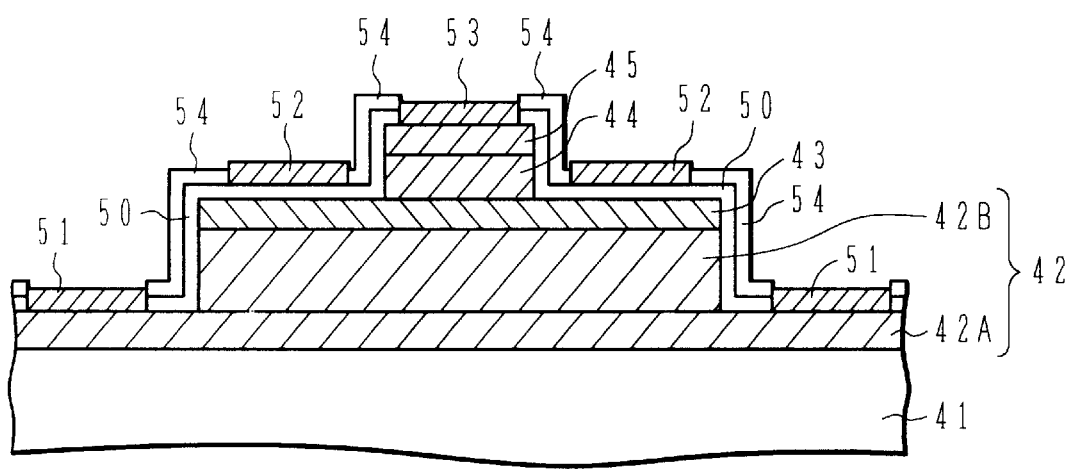
FIG. 5 is a cross sectional view of an HBT according to the first embodiment.

FIG. 5 is a cross sectional view of the HBT. Formed on the surface of a semi-insulating GaAs substrate 41 are a collector layer 42, a base layer 43, an emitter layer 44, and an emitter cap layer 45 in this order from the bottom.

The collector layer 42 has a two-layer structure made of a lower collector layer 42A and an upper collector layer 42B. The lower collector layer 42A is 500 nm thick and is made of n⁺-type GaAs having an Si concentration of $3\times10^{18}cm^{-3}$, and the upper collector layer 42B is 450 nm thick and is made of n-type GaAs having an Si concentration of $3\times10^{16}cm^{-3}$. The upper collector layer 42B forms a mesa structure over the lower collector layer 42A, and the partial upper surface of the lower collector layer 42A is exposed around the upper collector layer 42B.

The base layer 43 is 70 nm thick and is made of p⁺-type GaAs having a carbon concentration of $4\times10^{19}cm^{-3}$.

A lamination structure of the emitter layer 44 and emitter cap layer 45 forms a mesa structure over the base layer 43, and the partial upper surface of the base layer 43 is exposed around the emitter layer 44. The emitter layer 44 is 50 nm thick and is made of n-type InGaP having an Si concentration of $3\times10^{17}cm^{-3}$. The emitter cap layer 45 is made of n-type GaAs having an Si concentration of $3\times10^{17}cm^{-3}$ at the lower thickness portion of 150 nm and an Si concentration of $3\times10^{18}cm^{-3}$ at the upper thickness portion of 50 nm.

The surfaces of the collector layer 42, base layer 43, emitter layer 44 and emitter cap layer 45 are covered with an intermediate layer 50 of GaS having a thickness of 10 nm.

Openings are formed in the intermediate layer 50, at an upper surface area of the emitter cap layer 45 and at an upper surface area of the lower collector layer 42A exposed around the upper collector layer 42B. A collector electrode 51 is formed in the opening formed around the upper collector layer 42B, and an emitter electrode 53 is formed in the opening formed at the upper surface of the emitter cap layer 45. The collector and emitter electrodes 51 and 53 each have a lamination structure made of an AuGe layer 20 nm thick, an Ni layer 5 nm thick, and an Au layer 300 nm thick in this order from the bottom.

The interfaces between the collector electrode 51 and the lower collector layer 42A and between the emitter electrode 53 and the emitter cap layer 45 are alloyed by heat treatment and provide ohmic contacts.

A base electrode 52 is formed on the intermediate layer 50 in a peripheral area of the emitter layer 44 over the base layer 43. The base electrode may be a two-layer structure of Pt and Au in this order from the bottom or a four-layer structure of Pt, Ti, Pt and Au in this order from the bottom. Since the GaS intermediate layer 50 is inserted between the base electrode 52 and the base layer 43, an ohmic contact therebetween can be obtained without alloying the interface therebetween. Since the lowest layer of the base electrode 52 is made of Pt having a relatively large work function, the contact resistance between the p-type base layer 43 and the base electrode 52 can be lowered.

The surface of the intermediate layer 50 not covered with the base electrode 52 is covered with an $SiO_2$ film 54 of 500 nm in thickness.

Since the surface of the base layer 43, particularly the peripheral area of the emitter layer 44 is covered with the GaS intermediate layer 50, the pn junction region between the base and emitter does not directly contact an insulating film such as the $SiO_2$ film 54. Therefore, surface recombination at the pn junction region can be suppressed so that the HBT having a large current gain and a high reliability can be formed.

Next, a manufacture method of the HBT shown in FIG. 5 will be described. On the surface of the semi-insulating GaAs substrate 41, the lower collector layer 42A, upper collector layer 42B, base layer 43, emitter layer 44, and emitter cap layer 45 are deposited in this order from the bottom. Deposition of these layers may be performed by MOCVD. The emitter cap layer 45 and emitter layer 44 are patterned to expose the surface of the base layer 43. The emitter cap layer 45 is wet-etched with mixture solution of $H_3PO_4$, $H_2O_2$, and $H_2O$. The emitter layer 44 is wet-etched with mixture solution of HCl and $H_3PO_4$.

Next, the base layer 43 and upper collector layer 42A are patterned. This etching is stopped when the upper surface of the lower collector layer 42A is exposed, by controlling the etching time.

A GaS 10 nm thick is deposited over the whole surface of the substrate. This GaS film is used as the intermediate film 50 shown in FIG. 5. Deposition of the GaS film is performed by a method similar to the method of depositing the GaS intermediate layers 18A and 18B shown in FIG. 3. In order to deposit the GaS film on the side wall of the mesa structure with a good reproductivity, it is preferable to apply an GaS beam obliquely to the substrate surface.

An $SiO_2$ film is deposited to a thickness of 500 nm on the GaS film by PE-CVD at a substrate temperature of, for example, 300° C. This $SiO_2$ film is used as the $SiO_2$ film 54 shown in FIG. 5.

The $SiO_2$ film is covered with a resist pattern having openings in the areas corresponding to the collector and emitter electrodes 51 and 53. By using this resist pattern as a mask, the $SiO_2$ film is etched. The $SiO_2$ film is wet-etched with buffered hydrofluoric acid. Use of buffered hydrofluoric acid allows the $SiO_2$ film to be selectively etched relative to the underlying GaS film.

In succession, the GaS film is etched via the openings of the $SiO_2$ film. The GaS film is wet-etched with mixture solution of HCl and $H_3PO_4$. Use of this mixture solution allows the GaS film to be selectively etched relative to the underlying GaS film.

The GaAs surfaces exposed in the openings of the GaS film are etched by about 10 nm thick with mixture solution of $H_3PO_4$, $H_2O_2$, and $H_2O$. AuGe, Ni and Au films are sequentially deposited over the whole surface of the substrate to leave the collector and emitter electrodes 51 and 53 by lift-off. Heat treatment is performed for one minute at a temperature of 400° C. to alloy the metal and underlying GaAs.

Next, a resist pattern having an opening in an area corresponding to the base electrode 52 is deposited on the substrate. By using this resist pattern as a mask, the $SiO_2$ film is etched for forming an opening in an area corresponding to the base electrode 52. The intermediate layer 50 of GaS exposes on the bottom of the opening.

Pt and Au are sequentially deposited over the whole surface of the substrate to thereafter leave the base electrode 52 by lift-off. With the above processes, HBT shown in FIG. 5 can be manufactured.

In the example shown in FIG. 5, AuGe is used as the lowest layer of the emitter and collector electrodes 53 and 51, and made in direct contact with the GaAs layer to alloy the interface and form an ohmic contact. Instead of forming an ohmic contact by alloying, a GaS layer may be inserted therebetween to form an ohmic contact, similar to the connections between the first and second electrodes 19A and 19B and the first and second surface layers 15A and 15B shown in FIG. 3. In this case, the lowest layer of the electrode is preferably made of a material having a relatively low work function such as Ti, in order to lower the contact resistance to n-type GaAs.

Next, the second embodiment of the invention will be described.

Figure 6A:
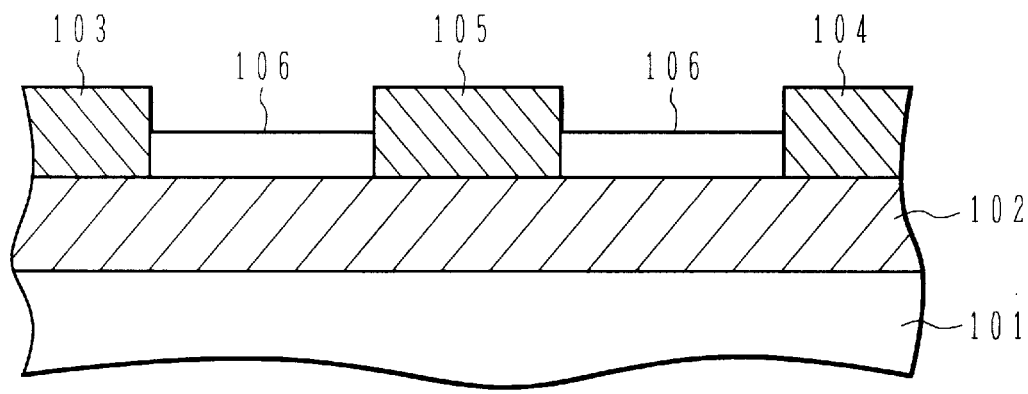
FIG. 6A and FIG. 6B are cross sectional views of FETs according to second and third embodiments of the invention, respectively.

FIG. 6A is a cross sectional view of an FET according to the second embodiment. A semi-insulating GaAs substrate 10 has an n-type GaAs surface layer 102 formed thereon. For example, the surface layer 102 is formed by implanting Si ions at an acceleration energy of 60 keV and at a dose of $2\times10^{12} cm^{-2}$.

A source electrode 103 and a drain electrode 104 are formed on the surface layer 102, the electrodes being spaced apart by a certain distance. A gate electrode 105 is formed on the surface layer 102 between the source and drain electrodes 103 and 104. The source, drain and gate electrodes 103, 104 and 105 are all formed directly on the surface layer 102.

The source and drain electrodes 103 and 104 each have a two-layer structure of an AuGe layer and an Au layer stacked in this order from the bottom. The interfaces between the electrodes 103 and 104 and the surface layer 102 are alloyed to provide ohmic contacts of the electrodes 103 and 104 to the surface layer 102. The gate electrode 105 is made of Al and has a Schottky contact to the surface layer 102.

The surface areas of the surface layer 102 between the gate electrode 105 and source electrode 103 and between the gate electrode 105 and drain electrode 104 are covered with a GaS compound layer 106 of about 10 nm in thickness. The GaS compound layer 106 has a thickness of at least two monolayers. The compositions of Ga and S are approximately 1:1. This composition ratio of Ga to S can be measured, for example, by Rutherford back scattering (RBS), Auger electron spectroscopy (AES) or the like.

For example, the GaS compound layer 106 is formed by vapor deposition of tertiary-butyl-gallium-sulfide cubane as a source material. If the deposition condition is properly set, the GaS composition layer 106 can be grown only on the surface layer 102 between the electrodes 103, 104 and 105 without being grown on these electrodes. For example, such a selective growth can be realized under the conditions of a source material temperature of 100° C., a substrate temperature of 380° C. and a pressure of $1\times10^{-4}$ to $1\times10^{-5}$ Pa.

The GaS compound layer 106 is not epitaxially grown on the GaAs surface layer 102. It was confirmed that the deposited GaS compound layer 106 was amorphous.

In the FET shown in FIG. 6A, the surface areas of the surface layer 102 between the source and gate electrodes 103 and 105 and between the drain and gate electrodes 105 are covered with the GaS compound layer 106. Since the GaS compound layer 106 covers the GaAs surface layer 102, the density of surface states of the surface layer 103 can be reduced. In order to achieve the sufficient effect of reducing the density of surface states, it is preferable to set the thickness of the GaS compound layer 106 to 3 nm or thicker.

In this second embodiment, the composition ratio of Ga to S of the GaS compound layer 106 is 1:1. The composition ratio is not always necessary to be strictly 1:1, but it is sufficient to have a substantial composition ratio of 1:1. This substantial composition ratio means that the ratio of 1:1 contains any error to be caused by an analysis precision of the measuring system, and that such an error is generally in a range of about +/−1%.

Figure 6B:
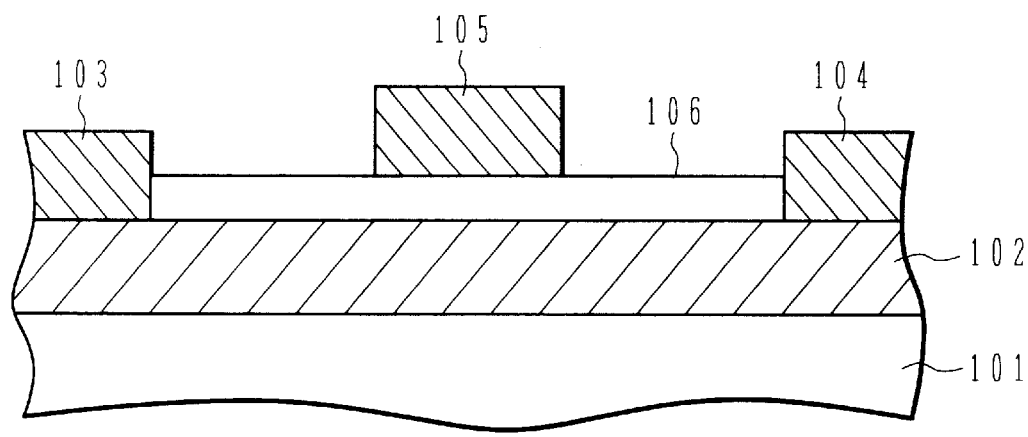

FIG. 6B is a cross sectional view of an FET according to the third embodiment. In the FET shown in FIG. 6A, the gate electrode 105 directly contacts the surface layer 102, whereas in the FET shown in FIG. 6B, a GaS compound layer 106 is inserted between the gate electrode 105 and surface layer 102. The other structures are the same as those of the FET shown in FIG. 6A.

In the second embodiment shown in FIG. 6A, the GaS compound layer 106 is deposited after the source, drain and gate electrodes 103, 104 and 105 are formed, whereas in the third embodiment shown in FIG. 6B, after the GaS compound layer 106 is deposited, the electrodes are formed. A resist pattern having openings in the areas corresponding to the source and drain electrodes 103 and 104 is formed on the GaS compound layer 106 deposited over the whole substrate surface. By using this resist pattern as a mask, openings are formed in the GaS compound layer 106. The source and drain electrodes 103 and 104 are formed by lift-off using this resist pattern. Similarly, the gate electrode 106 is formed on the GaS compound layer 106 through lift-off.

In the FET shown in FIG. 6B, the gate electrode 105 has a Schottky contact to the surface layer 102 via the GaS compound layer 106. Also in this case, similar to the FET shown in FIG. 6A, since the surface of the surface layer 102 is covered with the GaS compound layer 106, the density of surface states can be lowered.

Since the GaS compound layer 106 is formed before the source, drain and gate electrodes 103, 104 and 105 are formed, the electrodes 103 to 106 are not exposed to a high temperature environment when the GaS compound layer 106 is deposited. Accordingly, electrode materials having a relatively low melting point can be used.

Figure 7:
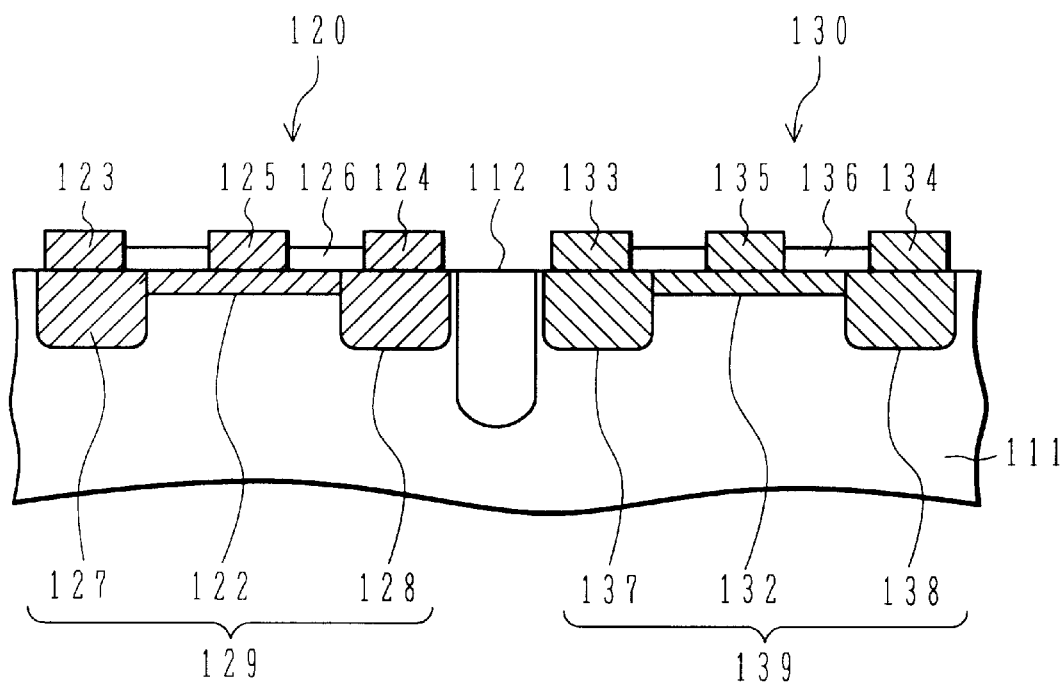
FIG. 7 is a cross sectional view of a MESFET according to a fourth embodiment of the invention.

FIG. 7 is a cross sectional view of an FET according to the fourth embodiment of the invention. In a partial region in the surface layer of a semi-insulating GaAs substrate 111, a high resistance element separation region 112 is formed to a certain depth. This element separation region 112 is formed by implanting oxygen ions.

An enhancement type MESFET 120 is formed in one active region defined by the element separation region 112, and in the other active region a depletion type MESFET 130 is formed. The MESFETs 120 and 130 have basically the same structure as those shown in FIG. 6A.

The MESFET 120 is constituted of a surface layer 129, a source electrode 123, a drain electrode 124, and a gate electrode 125. The surface layer 129 is constituted of a high concentration region 127 under the source electrode 123, a high concentration region 128 under the drain electrode 124, and a channel region 122 coupling the two high concentration regions 127 and 128. The high concentration regions 127 and 128 lower the contact resistance between the surface layer 129 and source electrode 123 and the contact resistance between the surface layer 129 and drain electrode 124, respectively. The channel region 122 has a Schottky contact to the gate electrode 125. In the surface layer 129, a region between the source electrode 123 and gate electrode 125 and a region between the drain electrode 124 and gate electrode 125 are covered with a GaS compound layer 126.

The MESFET 130 is constituted of a surface layer 139, a source electrode 133, a drain electrode 134, and a gate electrode 135. Similar to the MESFET 120, the surface layer 139 is constituted of high concentration regions 137 and 138 and a channel region 132. In the surface layer 139, a region between the source electrode 133 and gate electrode 135 and a region between the drain electrode 134 and gate electrode 135 are covered with a GaS compound layer 136.

By making the channel regions 122 and 132 have different impurity concentrations, it becomes possible to make the threshold values of the MESFETs 120 and 130 different. For example, if the impurity concentration of the channel region 132 is set higher than that of the channel region 122, MESFET 120 becomes of an enhancement type and the MESFET 130 becomes of a depletion type.

Next, a manufacture method of the MESFETs shown in FIG. 7 will be described. Si ions are implanted into a region where the enhancement type MESFET 120 of the semi-insulating GaAs substrate 111 is formed, under the conditions of an acceleration energy of 60 keV and a dose of $2 \times 10^{12} cm^{-2}$. Into a region where the depletion type MESFET 130 is formed, Si ions are implanted under the conditions of an acceleration energy of 60 keV and a dose of $4 \times 10^{12} cm^{-2}$. Into regions where the high concentration regions are formed, Si ions are implanted under the conditions of an acceleration energy of 120 keV and a dose of $3 \times 10^{13} cm^{-2}$.

Heat treatment is performed for 30 seconds at a temperature of 800° C. to activate implanted ions. With the above processes, the channel region 122 and high concentration regions 127 and 128 of MESFET 120 are formed and the channel region 132 and high concentration regions 137 and 138 of MESFET 130 are formed.

Oxygen ions are implanted into a region where the element separation region 112 is formed, to thereby make it have a high resistance.

The source electrodes 123 and 133 and drain electrodes 124 and 134 are formed by lift-off. Each of these electrodes 123, 124, 133 and 134 has a two-layer structure of AuGe/Au. Heat treatment is performed to alloy the interfaces between each of the electrodes 123, 124, 133 and 134 and a corresponding one of the high concentration regions 127, 128, 137 and 138.

The gate electrodes 125 and 135 are formed by lift-off. The gate electrodes 125 and 135 are made of Al.

The GaS compound layers 126 and 136 are selectively grown on the substrate surface not formed with the source electrodes 123 and 133, drain electrodes 124 and 134, and gate electrodes 125 and 135. In this case, although the GaS layer is deposited also on the element separation region, this GaS compound layer can be etched and removed by using a resist pattern having an opening only in an area corresponding to the element separation region 112. Alternatively, the element separation region 112 may be covered with an $SiO_2$ mask or the like when the GaS compound layer is deposited. The growth conditions are the same as those used when the GaS compound layer 106 shown in FIG. 6A is grown.

In the fourth embodiment shown in FIG. 7, before the GaS compound layers 126 and 136 are deposited, Si ions are implanted into the GaAs substrate 111 to form two regions 122 and 132 having different Si concentrations. With the above processes, MESFETs having different threshold values can be manufactured.

Figure 8:
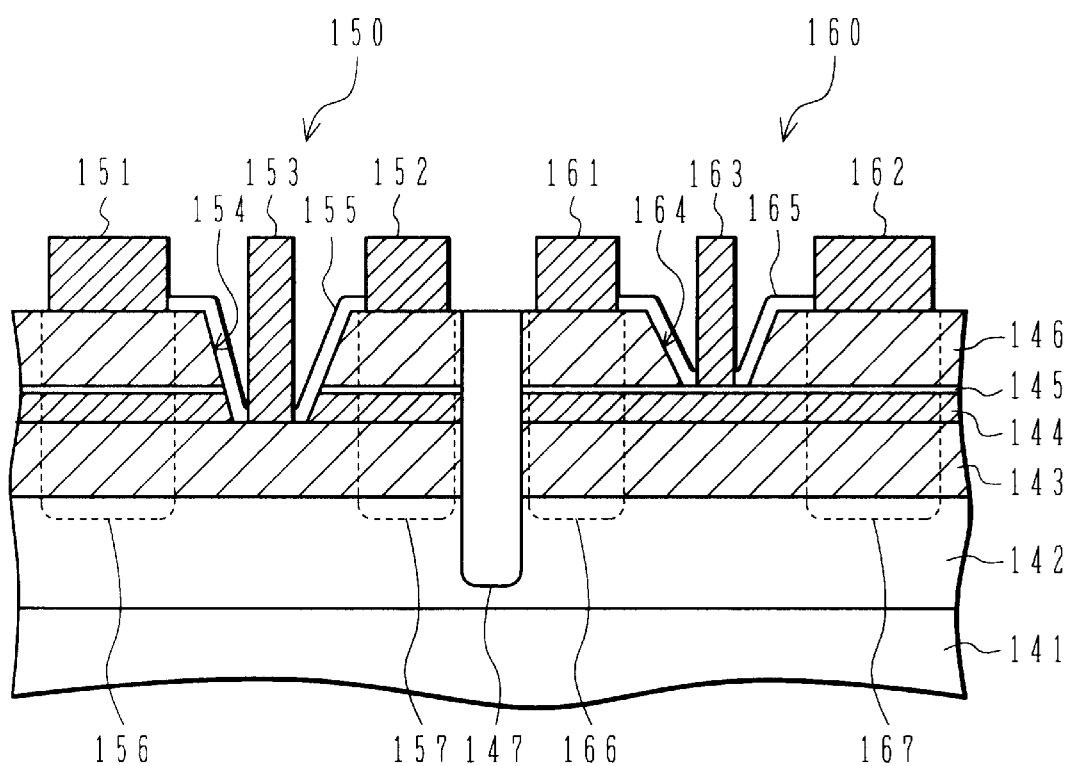
FIG. 8 is a cross sectional view of a HEMT according to a fifth embodiment of the invention.

FIG. 8 is a cross sectional view of an HEMT according to the fifth embodiment. On the surface of a semi-insulating GaAs substrate 141, a non-doped GaAs channel layer 142, an n-type AlGaAs carrier supply layer 143, an n-type GaAs first cap layer 144, an n-type AlGaAs etching stopper layer 145 and an n-type GaAs second cap layer 146 are sequentially formed in this order from the bottom.

The channel layer 142 has a thickness of 500 nm. The carrier supply layer 143 has a thickness of 20 nm, an impurity concentration of $2 \times 10^{18} cm^{-3}$, and an Al composition ratio of 0.25. The first cap layer 144 has a thickness of 7 nm and an impurity concentration of $2 \times 10^{18} cm^{-3}$. The etching stopper layer 145 has a thickness of 3 nm, an impurity concentration of $2 \times 10^{18} cm^{-3}$, and an Al composition ratio of 0.25. The second cap layer 146 has a thickness of 70 nm and an impurity concentration of $2 \times 10^{18} cm^{-3}$.

A high resistance element separation region 147 is formed extending from the upper surface of the second cap layer 146 to the inside of the channel layer 142.

The HEMT 150 is constituted of a source electrode 151, a drain electrode 152, and a gate electrode 153. The source and drain electrodes 151 and 152 each have a two-layer structure of AuGe/Au, and are disposed on the second cap layer 146 with a certain distance therebetween. In the region between the source and drain electrodes 151 and 152, a groove 154 is formed extending from the upper surface of the second cap layer 146 to the lower surface of the first cap layer 144. The gate electrode 153 is formed on the bottom of this groove 154.

Alloyed regions 156 and 157 are formed under the source and drain electrodes 151 and 152, respectively, extending from the upper surface of the second cap layer 146 to the inside of the channel layer 142. With these alloyed regions 156 and 157, the source and drain electrodes 151 and 152 have ohmic contacts to the channel layer 142.

A GaS compound layer 155 covers the substrate surface areas between the source and gate electrodes 151 and 152 and between the drain and gate electrodes 152 and 153.

The HEMT 160 is constituted of a source electrode 161, a drain electrode 162, a gate electrode 163, a groove 164, a GaS compound layer 165, and alloyed regions 166 and 167. As compared to the HEMT 150, only the depth of the groove 164 of the HEMT 160 is different, and other structures are similar to those of HEMT 150. The groove extends from the upper surface of the second cap layer 146 to the upper surface of the etching stopper layer 143.

Next, a manufacture method of the HEMT shown in FIG. 8 will be described with reference to FIGS. 9A and 9B.

Figure 9A:
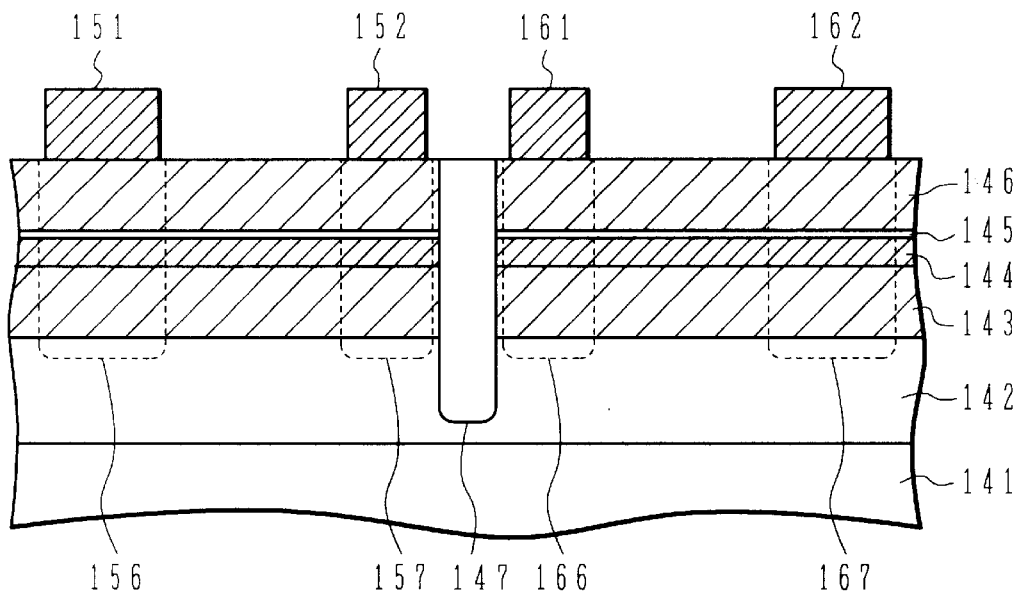
FIGS. 9A and 9B are cross sectional views of a substrate illustrating the method of manufacturing a HEMT of the fifth embodiment.

As shown in FIG. 9A, on the surface of the semi-insulating GaAs substrate 141, the layers from the channel layer 142 to the second cap layer 146 are sequentially deposited by MOCVD. Oxygen ions are implanted in the element separation region 147 to make it have a high resistance.

The source electrodes 151 and 161 and drain electrodes 152 and 162 are formed on the second cap layer 146. These electrodes are formed by formation of resist patterns, evaporation of an AuGe layer and an Au layer, and lift-off. A heat treatment is performed to alloy the regions under the electrodes 151, 152, 161 and 162 to form the alloyed regions 156, 157, 166 and 167.

Figure 9B:
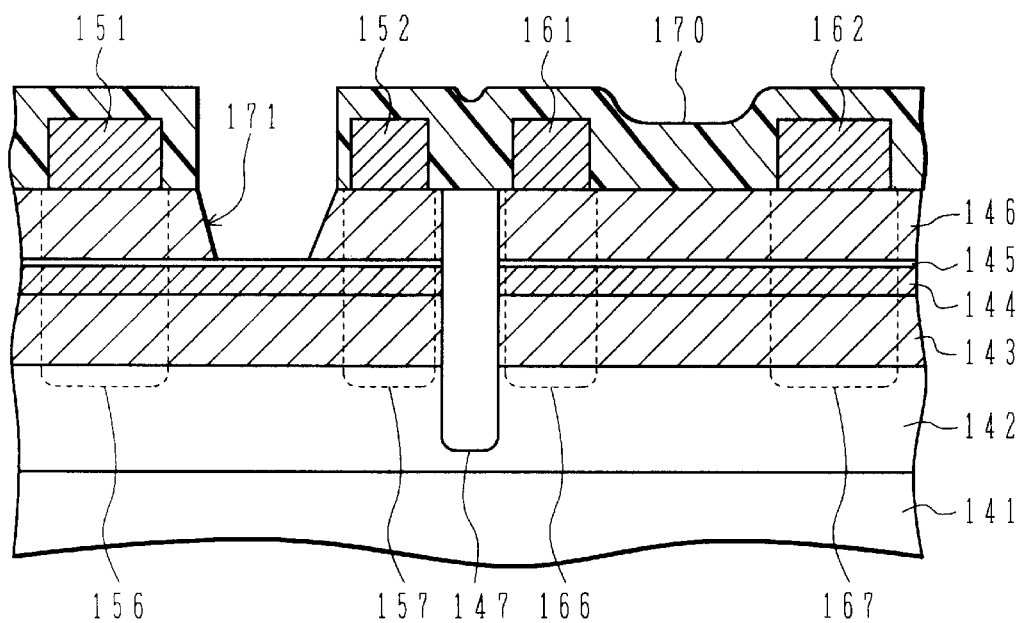

As shown in FIG. 9B, a resist pattern 170 having openings in the areas corresponding to the source and drain electrodes 151 and 152 is formed. By using this resist pattern 170 as a mask, the second cap layer 146 is dry-etched using $SiCl_4$ containing gas. This etching is automatically stopped at the etching stopper layer 145. An opening 171 is therefore formed in the second cap layer 146.

In succession, the etching stopper layer 145 exposed on the bottom of the opening 171 is wet-etched and removed with ammonium. This etching is automatically stopped at the first cap layer 144. Thereafter, the resist pattern 170 is removed.

Next, a resist pattern (not shown) having openings in the areas corresponding to the grooves 154 and 164 is formed. By using this resist pattern as a mask, the first and second cap layers 144 and 146 are etched by a method similar to the method used for forming the opening 171 shown in FIG. 9B. As a result, the groove 154 extending to the lower surface of the first cap layer 144 is formed in the active region where the HEMT 150 is formed, and the groove 164 extending to the lower surface of the second cap layer 146 is formed in the active region where the HEMT 160 is formed.

The gate electrodes 153 and 163 are formed on the bottoms of the grooves 156 and 164. The gate electrodes 153 and 163 are formed by the formation of resist patterns, evaporation of an Al film, and lift-off.

The GaS compound layers 155 and 165 are selectively formed on the areas where the source electrodes 151 and 161, drain electrodes 152 and 162, and gate electrodes 153 and 163 are not formed. With the above processes, the HEMT shown in FIG. 8 can be manufactured.

The HEMT 150 is of the enhancement type, and the HEMT 160 is of the depletion type. Since the cap layers 144 and 146 are formed on the carrier supply layer 143 and the etching stopper layer 145 is inserted therebetween, the depths of the grooves 154 and 164 on which the gate electrodes are formed can be controlled precisely and HEMTs having desired threshold values can be obtained.

In the first to fifth embodiments described above, GaAs is used as the substrate material and the surface of the GaAs layer is covered with the GaS compound layer. Reduction of the density of surface states can be expected even if the surface of a compound semiconductor layer made of materials other than GaAs is covered with the GaS compound layer.

Next, a semiconductor device and its manufacture method according to the sixth embodiment of the invention will be described with referent to FIGS. 10 to 17.

Figure 10:
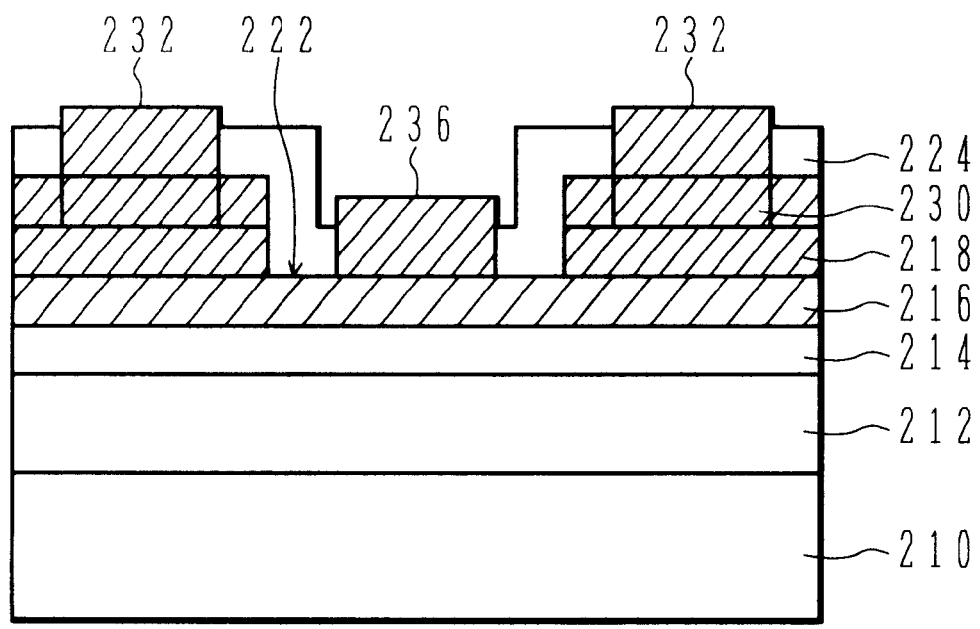
FIG. 10 is a schematic cross sectional view showing the structure of a semiconductor device according to a sixth embodiment of the invention.
Figure 14A:
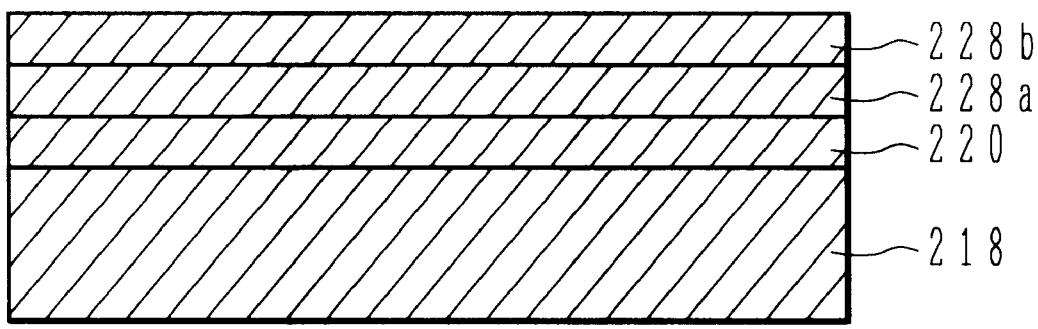
FIGS. 14A and 14B are schematic cross sectional views illustrating reactions during the process of forming an ohmic contact layer.
Figure 14B:
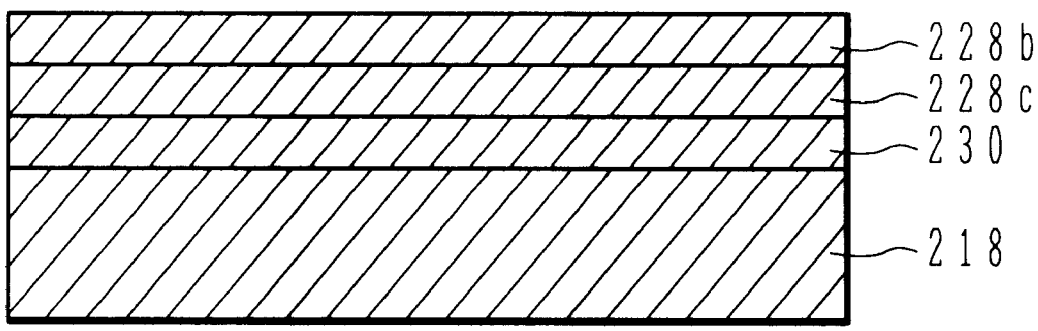
Figure 15:
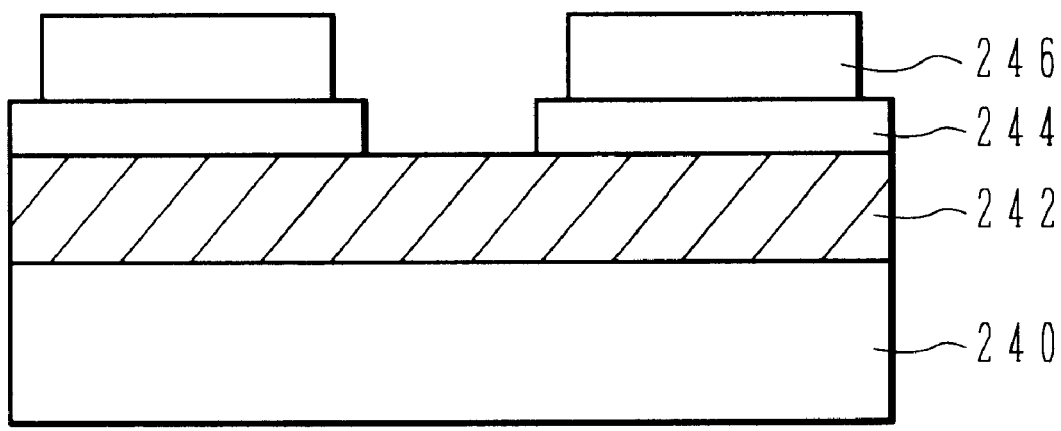
FIG. 15 is a schematic cross sectional view showing a sample structure used for measuring the electrical characteristics of the semiconductor device of the sixth embodiment.
Figure 16:
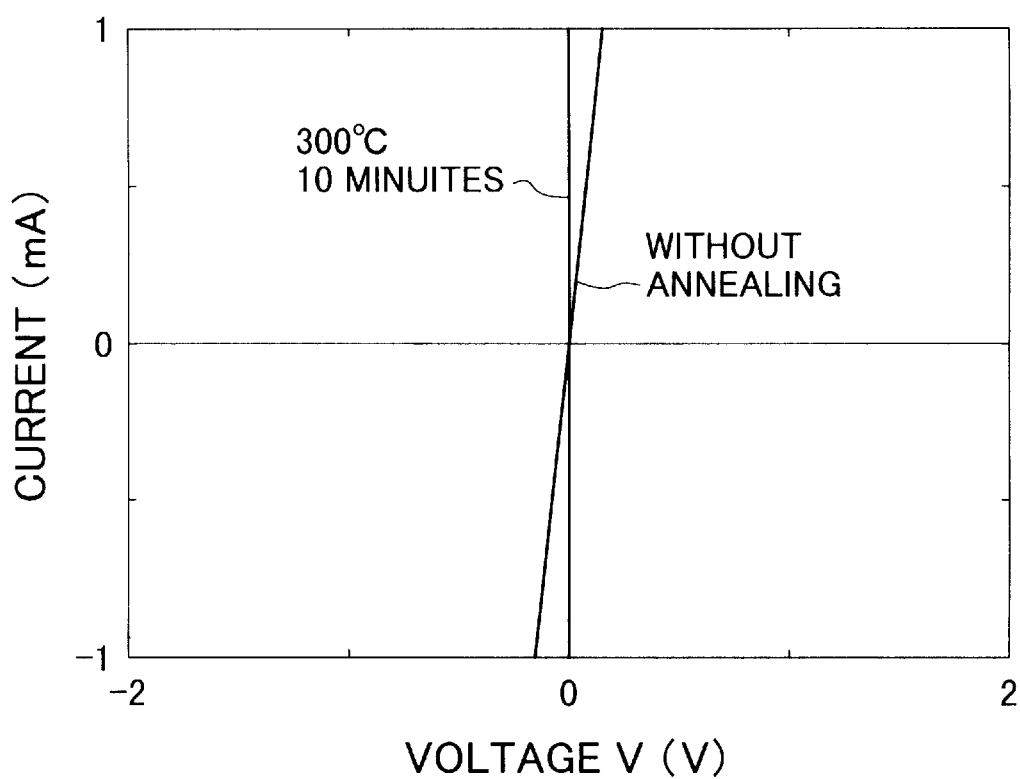
FIG. 16 is a graph showing the electrical characteristics of an ohmic contact layer of the semiconductor device of the sixth embodiment.
Figure 17:
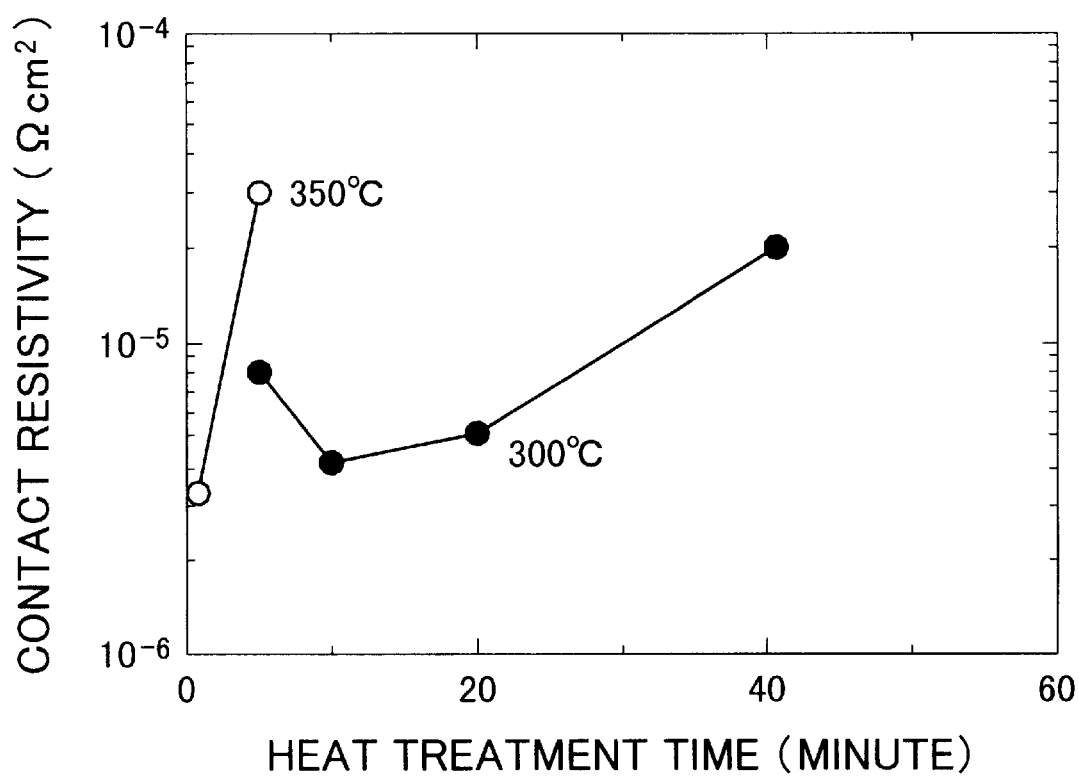
FIG. 17 is a graph showing the relation between a contact resistivity and a heat treatment temperature.

FIG. 10 is a schematic cross sectional view showing the structure of the semiconductor device according to the sixth embodiment. FIGS. 11A to 13B are cross sectional views illustrating a method of manufacturing the semiconductor device of the sixth embodiment. FIGS. 14A and 14B are schematic cross sectional views illustrating reactions during the process of forming an ohmic contact layer. FIG. 15 is a schematic cross sectional view showing a pattern structure used for measuring the electrical characteristics of the semiconductor device of the sixth embodiment. FIG. 16 is a graph showing the electrical characteristics of an ohmic contact layer of the semiconductor device of the sixth embodiment. FIG. 17 is a graph showing the relation between a contact resistivity and a heat treatment temperature.

First, the structure of a semiconductor device of the sixth embodiment will be described with reference to FIG. 10.

On the surface of a GaAs substrate 210, a buffer layer 212 of undoped GaAs is formed. On the surface of the buffer layer 212, a channel layer 214 of $In_{0.2}Ga_{0.8}As$ is formed. On the surface of the channel layer 214, an electron supply layer 216 of $n^+$-$Al_{0.3}Ga_{0.7}As$ is formed. On the surface of the electron supply layer 216, contact layers 218 of $n^+$-GaAs are formed. The contact layer 218 defines a recess region 222. A gate electrode 236 of Al is formed on the electron supply layer 216 exposed in the recess region 222. On the surface of each of the two contact layers 218 separated by the recess region 222, an ohmic contact layer 230 of TiGaS is formed. On the surfaces of the two ohmic contact layers 230, source and drain regions 232 are formed. The HEMT of this embodiment has the structure described above.

The semiconductor device of the sixth embodiment is featured in that the ohmic contact layer 230 provided for realizing ohmic contacts between metal layers and a semiconductor layer is made of TiGaS. Specifically, S (sulfur) in the TiGaS layer functions as passivation of the contact film 218 and contributes to reducing the density of surface states. The TiGaS layer operates like metal so that the resistance of the ohmic contact itself lowers. Accordingly, the contact performance of the semiconductor device can be improved considerably.

The method of manufacturing the semiconductor device of the sixth embodiment will be described with reference to FIGS. 11A to 13B.

Figure 11A:
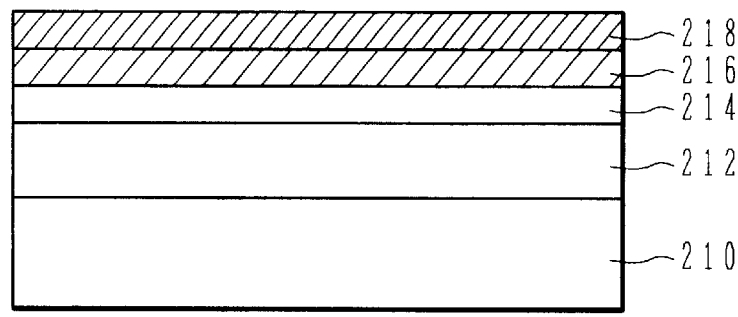
FIGS. 11A to 11C, 12A, 12B, 13A and 13B are cross sectional views illustrating a method of manufacturing the semiconductor device of the sixth embodiment.
Figure 11B:
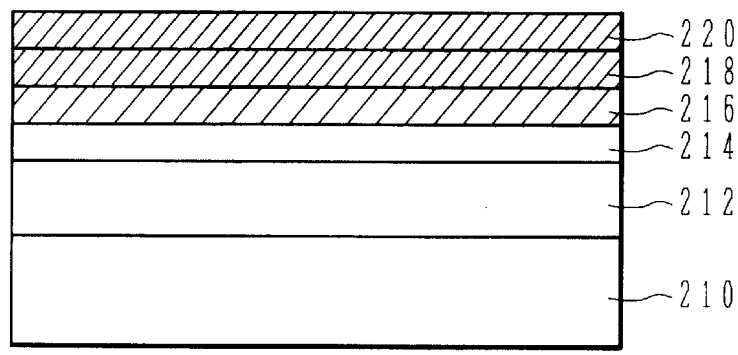

On the surface of the GaAs substrate 210, the buffer layer 212 of undoped GaAs having a thickness of about 500 nm, the channel layer 214 of $In_{0.2}Ga_{0.8}As$ having a thickness of about 15 nm, the electron supply layer 216 of $n^+$-$Al_{0.3}Ga_{0.7}As$ having a thickness of about 15 nm and a donor concentration of $2\times10^{18} cm^{-3}$, and the contact layer 218 of $n^+$-GaAs having a thickness of about 10 nm and a donor concentration of $2\times10^{18} cm^{-3}$ are sequentially grown epitaxially by MBE (FIG. 11A). For example, these layers are grown under the conditions of a substrate temperature of 580° C., a GaAs growth speed of 1 µm/h, and an AlGaAs growth speed of 1.3 µm/h.

Next, the GaAs substrate 210 with the epitaxially grown crystalline layers is placed in a MBE system for forming a GaS film. The substrate surface is cleaned with trisdimethylaminoarsine $As[N(CH_3)_2]_3$. Trisdimethylaminoarsine can effectively remove an oxide film at a low temperature. By spraying trisdimethylaminoarsine to the substrate surface, the surface oxide film can be removed. For example, the cleaning conditions are a substrate temperature of 500g° C., a flow rate of trisdimethylaminoarsine of 0.2 sccm, and a process time of 5 minutes.

In succession, an amorphous GaS layer 220 is deposited to a thickness of about 15 nm by MBE (FIG. 11B) on the contact layer 218 made of $n^+$-GaAs. For example, a source material $((t-Bu)GaS)_4$ placed in the PBN crucible of a Knudsen cell heated to 100° C. is sprayed to the substrate heated to a temperature of 350° C. by opening and closing a shutter, to thereby grow the GaS layer 220.

Figure 11C:
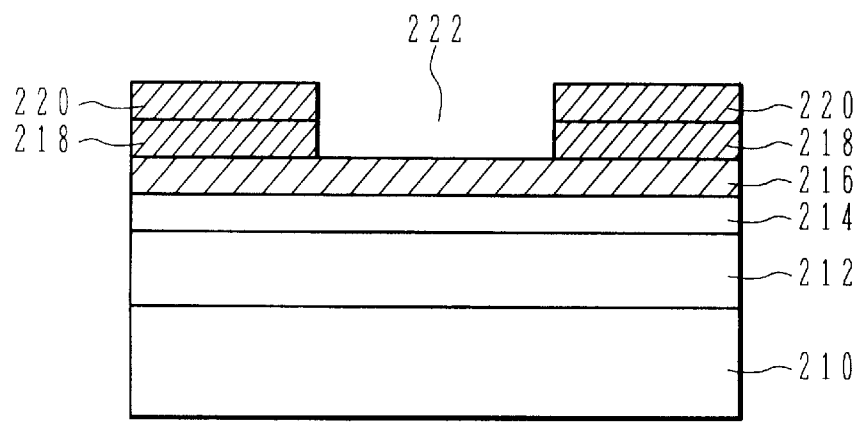

Thereafter, the GaS layer and contact layer 218 are partially etched to form the recess region 222 exposing the electron supply layer 216, the recess region 222 being used for forming the gate electrode thereon (FIG. 11C).

Figure 12A:
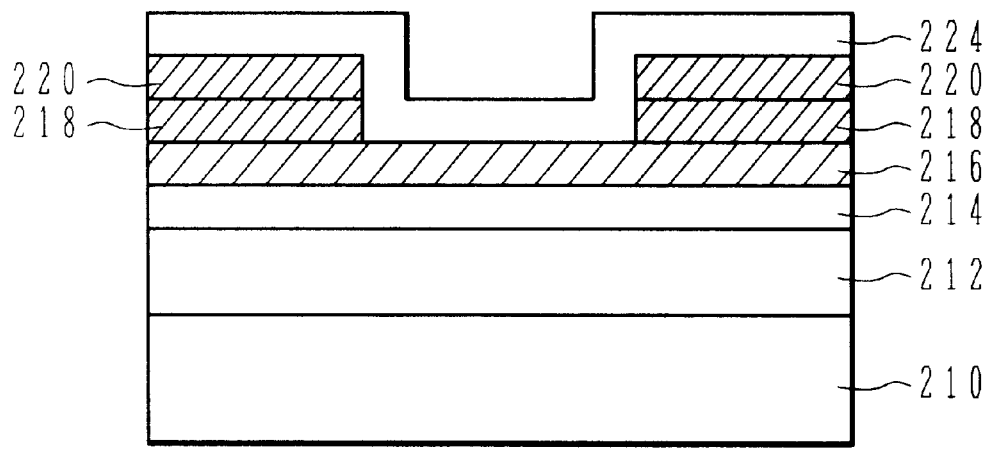

Next, an SiON film 224 is formed to a thickness of about 100 nm over the whole substrate surface, for example, by CVD (FIG. 12A). The SiON film 224 is used as the interlayer insulating film.

Next, the openings 226 are formed in the SiON film 224 on the contact layer 218, the opening being used for forming the ohmic contact regions.

Thereafter, a Ti (titanium) layer about 10 nm thick, a Pt (platinum) layer about 40 nm thick, and an Au (gold) layer about 300 nm thick are sequentially vapor deposited over the whole substrate surface.

Figure 12B:
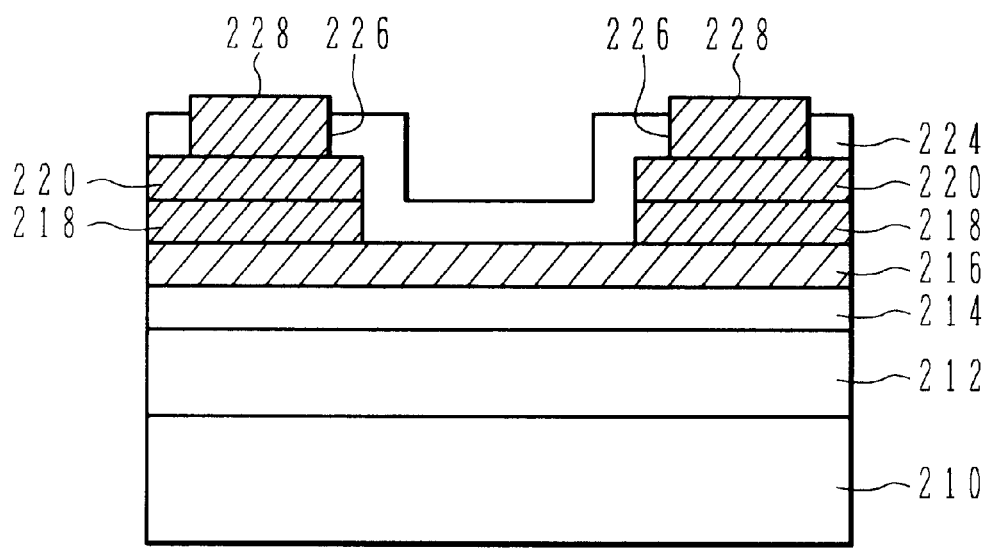

Next, conductive layers 228 of Au/Pt/Ti are left only in the openings 226 by lift-off (FIG. 12B).

Figure 13A:
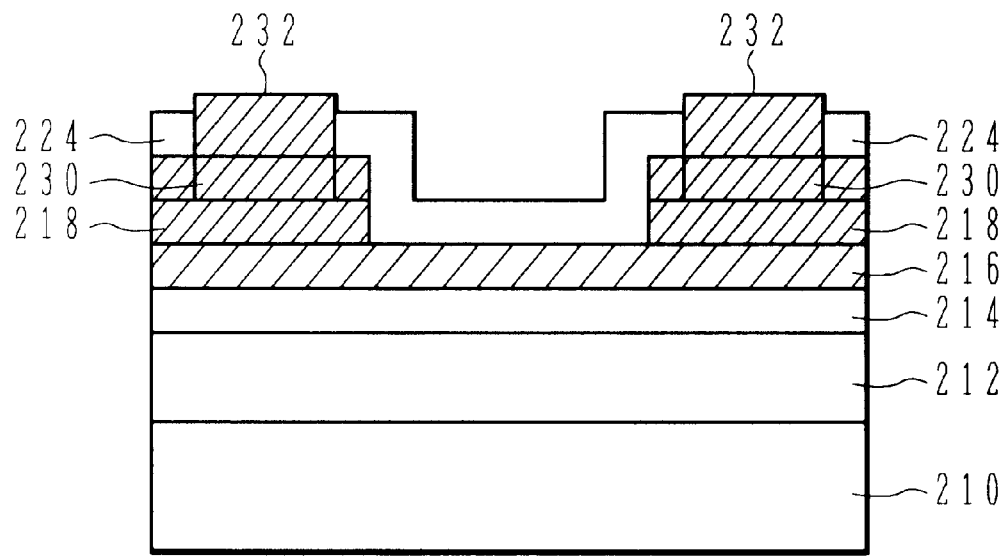

Next, a heat treatment is performed, for example, ten minutes at 300° C. to form ohmic contact layers 230 formed through reaction between the GaS layer 220 and Ti layer, and the source and drain electrodes 232 of Au/Pt/Ti (FIG. 13A).

As shown in FIG. 14A, with this heat treatment, a replacement reaction occurs between Ti in the Ti layer 228a and Ga in the GaS layer 220. As shown in FIG. 14B, with this replacement reaction, on the surface of the $n^+$-GaAs contact layer 218, the TiGaS ohmic contact layer 230 is formed, and on the surface of the ohmic contact layer 230, a TiGa layer 228c with parts of Ti being replaced by Ga is formed. S (sulfur) in the TiGaS layer formed in the above manner, functions as passivation of the contact layer 218 and contributes to reducing the density of surface states of GaAs. The TiGaS layer operates like metal so that the resistance of the ohmic contact itself lowers. In the above manner, the ohmic contact between the Pt layer 228b and contact layer 218 is formed.

Figure 13B:
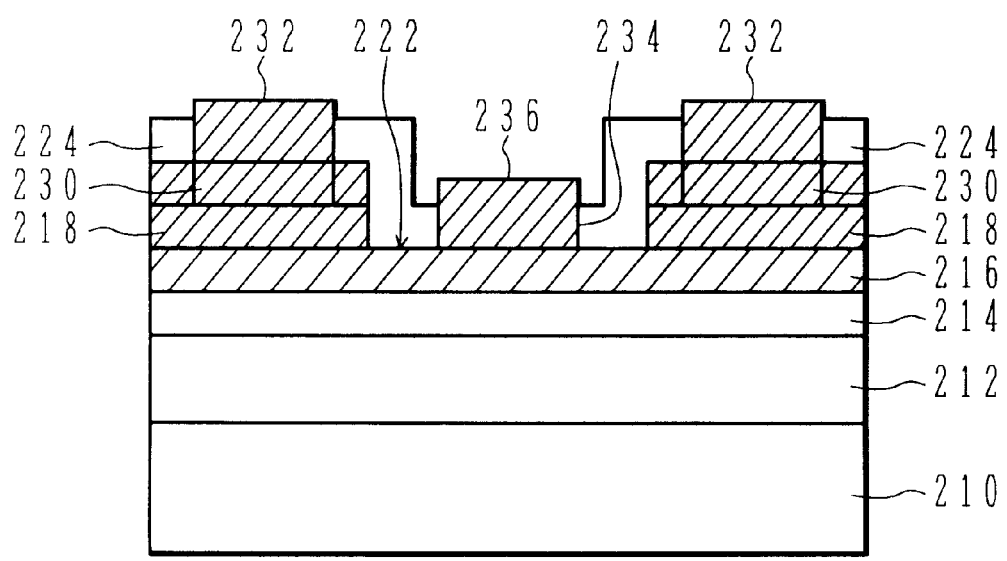

As shown in FIG. 13B, an opening 234 is formed in the SiON film 224 on the recess region 22 for the preparation of forming the gate electrode.

Next, an Al (aluminum) film is deposited to a thickness of about 200 nm over the whole substrate surface, for example, by vacuum vapor deposition, and then through lift-off the gate electrode 236 of Al is formed in the opening 234.

With the above processes, an HEMT can be manufactured having an ohmic contact of a low contact resistance and an improved ohmic property between the source and drain regions 232 and the electron supply layer 216.

The effects of the ohmic contact layer 230 was evaluated. FIG. 15 is a cross sectional view of a sample pattern structure used for evaluation. On a GaAs substrate 240, an $n^+$-GaAs layer 242 was epitaxially grown. On the surface of the $n^+$-GaAs layer 242, two GaS layers 244 were formed spaced apart by a certain distance. On the surface of each of the two GaS layers 244, a conductive layer 246 of a lamination structure of Au/Pt/ti was formed. After the conductive layer 246 was formed, a heat treatment was performed for forming ohmic contact layers. Some samples were not subjected to the heat treatment in order to compare the structures with or without the ohmic contact layers.

The current-voltage characteristics of each sample pattern formed in the above manner were measured. FIG. 16 shows the current-voltage characteristics. Samples not subjected to the heat treatment had a contact resistivity of about , $4 \times 10^{-3}$ $\Omega \cdot cm^2$, whereas samples subjected to the heat treatment could be lowered to a contact resistivity of about $4 \times 10^{-6} \Omega \cdot cm^2$. This contact resistivity is fairly compatible with that of $10^{-6} \Omega \cdot cm^2$ of a conventional alloy type structure using AuGeNi.

FIG. 17 is a graph showing the relation between a contact resistivity and a heat treatment temperature. In FIG. 17, an empty white circle indicates a heat treatment at 350° C. and a solid black circle indicates a heat treatment at 300° C.

As shown, with the heat treatment at 300° C., although the contact resistivity gradually lowers during the initial ten minutes or so, it rises thereafter. The reason for this may be as in the following. The contact resistivity lowers during the initial stage of heat treatment because the TiGaS layer is formed on the contact layer. As the heat treatment continues further, Ti diffuses into the contact layer 218 and increases the resistance of the contact layer 218.

With the heat treatment at 350° C., the contact resistivity can be lowered to about $3 \times 10^{-6} \Omega \cdot cm^2$, although as the heat treatment continues further, the contact resistivity increases rapidly.

The contact resistivity changes greatly with the heat treatment conditions and the thickness of the GaS layer. It is therefore desired to determine the proper heat treatment conditions in accordance with the thickness of the GaS film, when the ohmic contact layer 230 is formed. If Ti diffuses into the contact layer 218, the resistance of the contact layer 218 increases. Therefore, the heat treatment conditions are determined such that at least the replacement reaction between Ti in the Ti layer and Ga in the GaS layer occurs and that Ti in the Ti layer does not diffuse into the contact layer 218.

In the sixth embodiment, since the TiGaS ohmic contact layer 230 is formed on the $n^+$-GaAs contact layer 218, the contact resistivity between the contact layer 218 and the source and drain electrodes 232 can be lowered to a value roughly equal to that of the alloy structure using AuGeNi. It is possible to provide an ohmic contact excellent in reliability.

In the six embodiment, after the GaS layer and Ti layer are formed on GaAs, the TiGaS ohmic contact layer 230 is formed by heat treatment. In this case, all Ga atoms in the GaS layer 220 may be replaced by Ti atoms to form the ohmic contact layer 230 made of a TiS layer. Similar effects described above can be expected if the ohmic contact layer 230 contains S having the passivation effect relative to the surface level of GaAs and also contains Ti having a small work function relative to GaAs. Therefore, it is sufficient if the ohmic contact layer 230 contains at least Ti and S.

Other elements having the passivation effect relative to the surface level of GaAs may be Se (selenium) and Te (tellurium).

Figure 18:
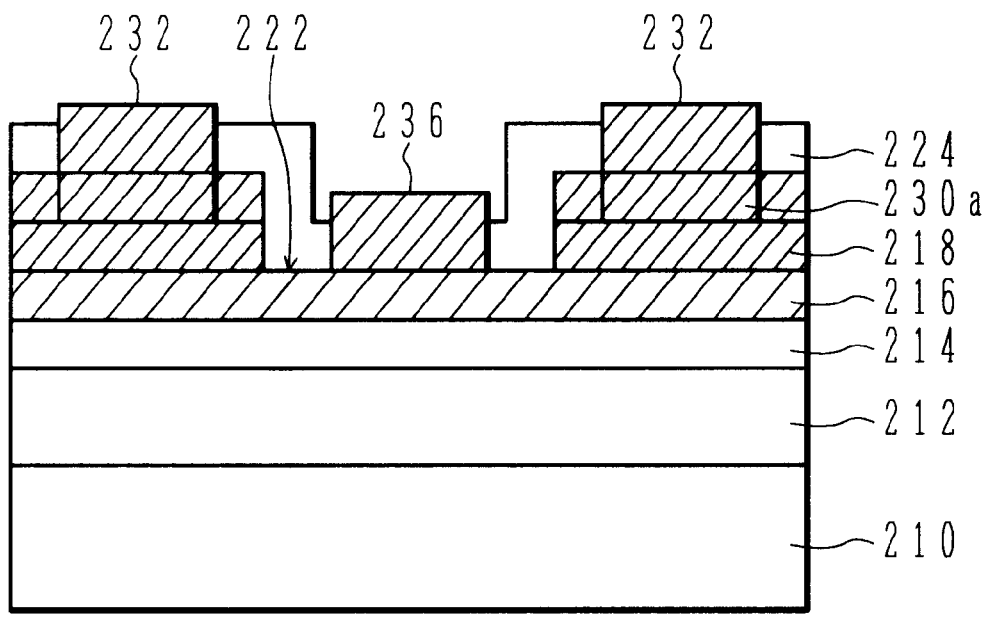
FIGS. 18 and 19 are schematic cross sectional views showing a semiconductor device according to a modification of the sixth embodiment, and its manufacture method.
Figure 19:
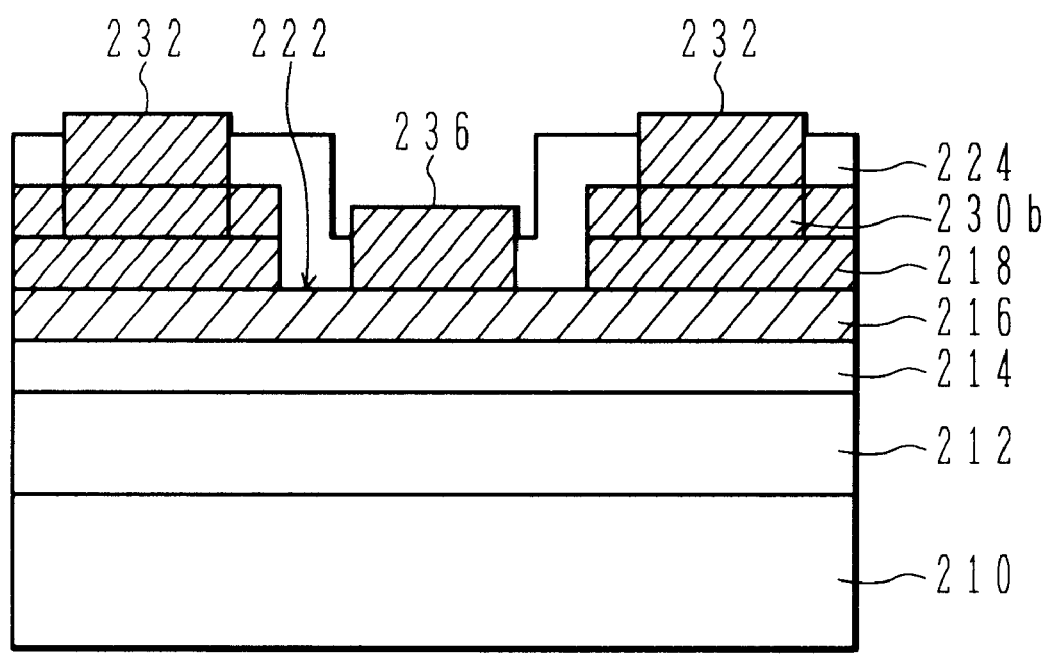

Specifically, as shown in FIG. 18, on the contact layer 218 of GaAs, a GaSe layer or GaTe layer and a Ti layer are be deposited to form an ohmic contact layer 230a made of a TiGaSe layer or TiSe layer thorough heat treatment. Alternatively, as shown in FIG. 19, an ohmic contact layer 230b made of a TiGaTe layer or TiTe layer is formed. Similar effects of the sixth embodiments can be expected also for the structures shown in FIGS. 18 and 19.

For example, the source materials for these layers may be tertiary-butyl-gallium-selenide cubane $((t-Bu)GaSe)_4$, tertiary-butyl-gallium-telluride cubane $((t-Bu)GaTe)_4$, solid Ga, solid Se, and solid Te.

Next, a semiconductor device and its manufacture method according to the seventh embodiment of the invention will be described with reference to FIGS. 20A and 20B.

Figure 20A:
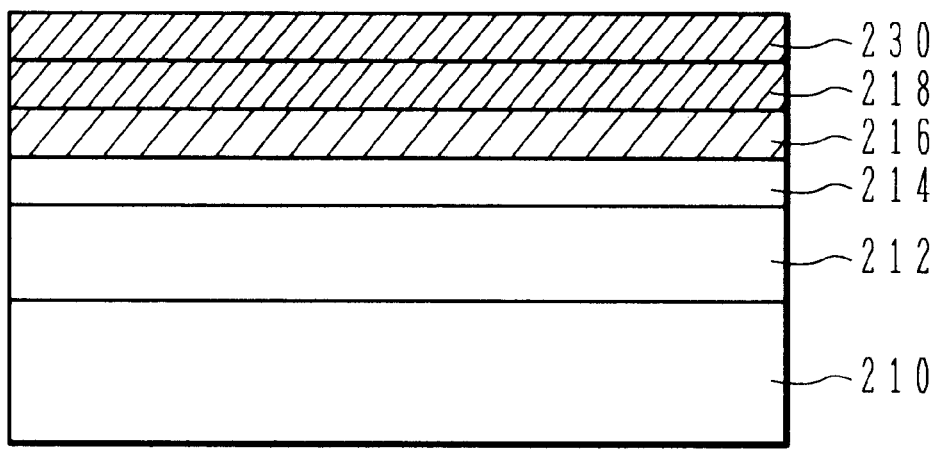
FIGS. 20A and 20B are schematic cross sectional views showing the structure of a semiconductor device according to a seventh embodiment of the invention, and its manufacture method.
Figure 20B:
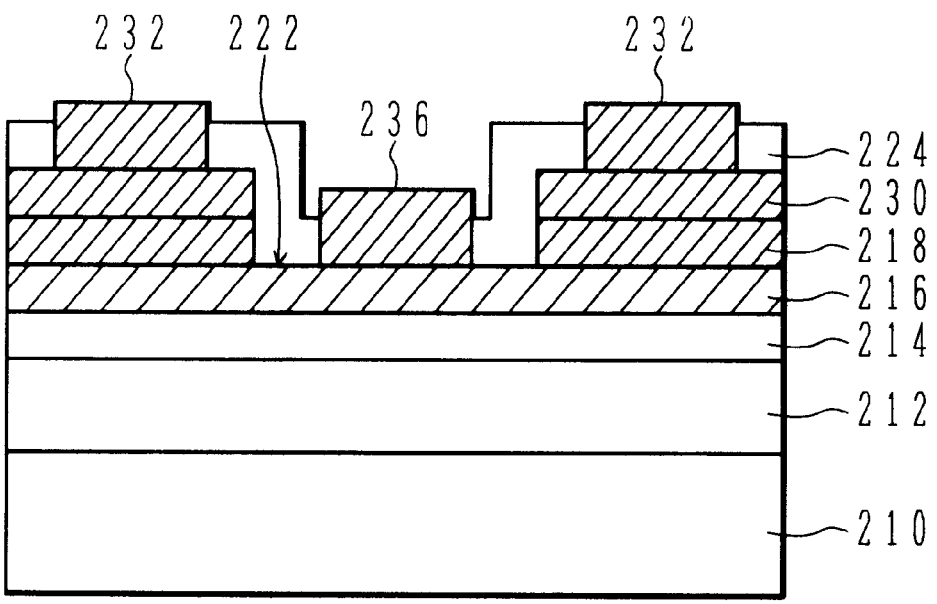

FIGS. 20A and 20B are schematic cross sectional views illustrating a semiconductor device and its manufacture method of the seventh embodiment.

In the sixth embodiment of the semiconductor device and its manufacture method, the GaS layer and Ti layer are reacted with each other to form a TiGaS ohmic contact layer 232 on the contact layer 218. The reaction between the GaS layer and Ti layer is not necessarily required in order to obtain the above effects given by the TiGaS layer. A low resistance ohmic contact layer may be formed by directly growing the TiGaS layer on GaAs.

At the process shown in FIG. 20A, instead of forming the GaS layer 220, a TiGaS layer is directly grown and is used as the ohmic contact layer 230 (FIG. 20A). Source and drain electrodes 232 are deposited on the ohmic contact layers 230 so that the ohmic contact having a low resistance excellent in reliability can be formed with high controllability (FIG. 20B).

The TiGaS layer 230 may be formed by MBE using solid Ga and $Ti(S-t-Bu)_4$.

In the seventh embodiment, since the TiGaS ohmic contact layer 230 is directly formed on the GaAs contact layer 218, the contact resistivity in the contact region can be lowered to a value roughly equal to that of the alloy structure using AuGeNi. It is possible to provide an ohmic contact excellent in reliability with high controllability.

In the seventh embodiment, although a TiGaS layer is used as the ohmic contact layer, a TiS layer instead of the TiGaS layer may be formed similar to the sixth embodiment, with similar advantageous effects as above. Alternatively, the ohmic contact layer 230 made of a TiGaSe layer (TiSe layer) or a TiGaTe layer (TiTe layer) may be formed on GaAs, with similar advantageous effects as above.

The present invention is not limited only to the above embodiments, but various modifications are possible.

For example, in the sixth and seventh embodiments, an ohmic contact layer is formed on GaAs. Similar advantageous effects as above can also be obtained by using other compound semiconductor materials of the group III–V same as GaAs. For example, even if compound semiconductor materials such as AlGaAs, InGaAs, InAlAs, InGaP, InAlP, InGaAlAs, InGaAlP, InP, GaP and AlP are used, a low resistance ohmic contact can be obtained by incorporating the above-described structures.

Also in the six and seventh embodiments, although the ohmic contact layer is applied to an HEMT, the ohmic contact between group III–V compound semiconductor materials and metal layers can be applied to various semiconductor devices.

The present invention has been described in connection with the preferred embodiments. The invention is not limited only to the above embodiments. It is apparent that various modifications, improvements, combinations, and the like can be made by those skilled in the art.

What is claimed is:

1. A semiconductor device comprising:
   a substrate having a first surface layer in a surface area, the first surface layer being made of a compound semiconductor material;
   a first intermediate layer formed on the first surface layer, made of a compound material containing Ga as a group III element and S as a group VI element, and having a thickness of at least two monolayers or thicker; and
   a first electrode formed on the first intermediate layer, the first electrode being electrically connected to the first surface layer with an ohmic contact.

2. A semiconductor device according to claim 1, wherein the first intermediate layer is made of GaS.

3. A semiconductor device according to claim 1, wherein the first surface layer and the first intermediate layer are of a same conductivity type.

4. A semiconductor device according to claim 1, wherein the first surface layer is made of one of materials selected from a group consisting of GaAs, AlGaAs, InGaP, InP, InGaAs, InAlAs, InAlGaAs, GaN, AlGaN, InGaN, InAlN, InN, AlN, InAlGaN, InGaAsN, InAlAsN and InAlGaAsN.

5. A semiconductor device according to claim 1, wherein a thickness of the first intermediate layer is 5 to 20 nm.

6. A semiconductor device according to claim 1, further comprising:
   a second surface layer disposed in another surface area spaced apart from the first surface layer by a certain distance, the second surface layer being made of a same compound semiconductor material as the first surface layer;
   a second intermediate layer formed on the second surface layer, made of a same compound material as the first intermediate layer, and having a thickness of at least two monolayers or thicker;
   a second electrode formed on the second intermediate layer, the second electrode being electrically connected to the second surface layer with an ohmic contact;
   a channel layer disposed in an area between the first and second surface layers, coupled to the first and second surface layers, and made of a compound semiconductor material; and
   a gate electrode formed on the channel layer and electrically connected to the channel layer with a Schottky contact.

7. A semiconductor device according to claim 6, wherein the first intermediate layer covers surfaces of the first surface layer and the channel layer between the first electrode and the gate electrode, and the second intermediate layer covers surfaces of the second surface layer and the channel layer between the second electrode and the gate electrode.

8. A semiconductor device according to claim 1, wherein the substrate comprises:
   a support substrate having a principal surface;
   a channel layer formed on the principal surface of the support substrate and made of a non-doped compound semiconductor material; and
   a carrier supply layer formed on the channel layer, having a band gap larger than a band gap of the channel layer, and made of a compound semiconductor material doped with conductive impurities, wherein the first surface layer is formed on the carrier supply layer in a surface area thereof, and wherein the semiconductor device further comprises:

a second surface layer disposed in another surface area of the carrier supply layer spaced apart from the first surface layer by a certain distance, the second surface layer being made of a same compound semiconductor material as the first surface layer;

a second intermediate layer formed on the second surface layer, made of a same compound material as the first intermediate layer, and having a thickness of at least two monolayers or thicker;

a second electrode formed on the second intermediate layer, the second electrode being electrically connected to the second surface layer with an ohmic contact; and a gate electrode electrically connected to the carrier supply layer with a Schottky contact at the area between the first surface layer and the second surface layer.

9. A semiconductor device according to claim 8, wherein the first intermediate layer covers surfaces of the first surface layer and the carrier supply layer between the first electrode and the gate electrode, and the second intermediate layer covers surfaces of the second surface layer and the carrier supply layer between the second electrode and the gate electrode.

10. A semiconductor device according to claim 1, further comprising:

a second electrode formed on a surface of the first intermediate layer where the first electrode is not formed, the second electrode being disposed spaced apart from the first electrode by a certain distance and electrically connected to the second electrode with an ohmic contact;

an insulating layer formed on a surface of the first intermediate layer between the first and second electrodes; and a gate electrode formed on the insulating layer.

11. A semiconductor device comprising:

a substrate having a principal surface;

a collector layer formed on the principal surface of the substrate and made of a compound semiconductor material of a first conductivity type;

a base layer formed on a partial surface area of the collector layer and made of a compound semiconductor material of a second conductivity type opposite to the first conductivity type;

an emitter layer formed on a partial surface area of the base layer and made of a compound semiconductor material of the first conductivity type;

a collector electrode formed on a surface of the collector layer where the base layer is not formed, the collector electrode being electrically connected to the collector layer with an ohmic contact;

a base electrode formed on a surface of the base layer where the emitter layer is not formed, the base electrode being electrically connected to the base layer with an ohmic contact;

an emitter electrode formed on a surface of the emitter layer and electrically connected to the emitter layer with an ohmic contact; and an intermediate layer disposed at least one area between the collector electrode and the collector layer, between the base electrode and the base layer, or between the emitter electrode and the emitter layer, the intermediate layer being made of a compound material containing Ga as a III group III element and S as a VI group VI element and having a thickness of at least two monolayers or thicker.

12. A semiconductor device according to claim 11, wherein the intermediate layer is disposed between the base electrode and the base layer and covers a surface area of the base layer between the base electrode and the emitter layer.

13. A semiconductor device comprising:

a substrate having a surface layer made of a compound semiconductor material;

a source electrode and a drain electrode directly formed on the surface layer of the substrate and spaced apart by a certain distance in an in-plane of the surface layer;

a gate electrode formed on a surface area of the surface layer between the source electrode and the drain electrode and spaced apart from the source electrode and the drain electrode by a certain distance; and a GaS compound layer covering surface areas of the surface layer of the substrate between the gate electrode and the drain electrode and between the source electrode and the drain electrode and having a thickness of at least two monolayers or thicker.

14. A semiconductor device according to claim 13, wherein a substantial composition ratio of Ga and S of the GaS compound layer is 1:1.

15. A semiconductor device according to claim 13, wherein a thickness of the GaS compound layer is 3 nm or thicker.

16. A semiconductor device according to claim 13, wherein the GaS compound layer is also inserted between the surface layer of the substrate and the gate electrode.

17. A semiconductor device according to claim 13, wherein the gate electrode is in direct contact with the surface layer of the substrate, the semiconductor device further comprises:

another source electrode and another drain electrode directly formed on the surface layer of the substrate and spaced apart by a certain distance in an in-plane of the surface layer;

another gate electrode directly formed on a surface area of the surface layer between the other source electrode and the other drain electrode and spaced apart from the other source electrode and the other drain electrode by a certain distance; and another GaS compound layer covering surface areas of the surface layer of the substrate between the other gate electrode and the other source electrode and between the other gate electrode and the other drain electrode and having a thickness of at least two monolayers or thicker, and an impurity concentration of a region of the surface layer of the substrate under the gate electrode is different from an impurity concentration of a region of the surface layer of the substrate under the other gate electrode.

18. A semiconductor device according to claim 13, wherein the surface layer of the substrate comprises a channel layer made of a non-doped compound semiconductor material, a carrier supply layer doped with conductive impurities, and a cap layer made of a compound semiconductor material of a same conductivity type as the carrier supply layer, respectively stacked in this order from a bottom layer, a groove is formed in a region of the surface layer between the source electrode and the drain electrode, tile groove having a depth not reaching the channel layer, and the gate electrode is formed on a bottom of the groove.

19. A semiconductor device according to claim 13, further comprising:

another source electrode and another drain electrode directly formed on the surface layer of the substrate and spaced apart by a certain distance in an in-plane of the surface layer;

another groove formed in a region of the surface layer between the other source electrode and the other drain electrode, the other groove having a depth not reaching the channel layer arid different from the groove;

another gate electrode formed on a bottom of the other groove and spaced apart by a certain distance from the other source electrode and the other drain electrode; and another GaS compound layer covering surface areas of the surface layer of the substrate between the other gate electrode and the other source electrode and between the gate electrode and the other drain electrode and having a thickness of at least two monolayers or thicker.

20. A semiconductor device according to claim 19, wherein the cap layer comprises two layers made of materials having different etching resistances, an interface between the two layers being set to a certain depth, the groove has the bottom at a level deeper than the interface, and the interface is exposed on the bottom of the other groove.

21. A semiconductor device comprising:

a III–V group III–V compound semiconductor layer:

an ohmic contact layer formed on the III–V group compound semiconductor layer, the ohmic contact layer containing at least Ti, and S, Se or Te; and a metal layer formed on the ohmic contact layer.

22. A semiconductor device comprising:

a channel layer formed on a semiconductor substrate;

an electron supply layer formed on the channel layer;

a contact layer formed on the electron supply layer and made of a III–V group III–V compound semiconductor material;

an ohmic contact layer formed on the contact layer, the ohmic contacts layer containing at least Ti, and S, Se or Te;

a source electrode and a drain electrode formed on the ohmic contact layer; and a gate electrode formed on the electron supply layer between the source electrode and the drain electrode.

* * * * *